US008705280B2

(12) United States Patent　　(10) Patent No.: US 8,705,280 B2
Cai et al.　　(45) Date of Patent: Apr. 22, 2014

(54) ELECTRICALLY PROGRAMMABLE FLOATING COMMON GATE CMOS DEVICE AND APPLICATIONS THEREOF

(75) Inventors: Jin Cai, Cortlandt Manor, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 12/786,956

(22) Filed: May 25, 2010

(65) Prior Publication Data

US 2011/0292733 A1　Dec. 1, 2011

(51) Int. Cl.
*G11C 11/34*　(2006.01)

(52) U.S. Cl.
USPC .............................. 365/185.14; 365/185.28

(58) Field of Classification Search
USPC ...................................... 365/185.14, 185.28
See application file for complete search history.

(56) References Cited

U.S. PATENT DOCUMENTS 5,600,267 A * 2/1997 Wong et al. ..................... 326/73

OTHER PUBLICATIONS

F. Masuoka, et al., "A New Flash EEPROM Cell Using Triple Polysilicon Technology" IEEE IEDM Technical Digest, 1984, p. 464.
C. Hsu, et al., "A High Speed, Low Power P-Channel Flash EEPROM Using Silicon Rich Oxide As Tunneling Dielectric" Extended abstract of the 1992 International Conference on Solid State Devices and Materials, Tsukaba, pp. 140-142.
S. Yamada, et al., "A Self-Convergence Erasing Scheme for a Simple Stacked Gate Flash EEPROM" IEDM, 1991, pp. 307-310.

* cited by examiner

*Primary Examiner* — Jason Lappas
(74) *Attorney, Agent, or Firm* — Scully, Scott, Murphy & Presser, P.C.; Louis J. Percello, Esq.

(57) ABSTRACT

A programmable CMOS device includes a PFET and an NFET that have a common floating gate. Depending on the configuration, the programmable CMOS device can be programmed, erased, and re-programmed repeatedly. The programming, erasure, and/or reprogramming can be effected by injection of electrons and/or holes into the floating gate. The programmable CMOS device can be employed as a fuse or an antifuse, to program a floating gate of another device, and/or to function as a latch. The programmable CMOS device can be formed employing standard logic compatible processes, i.e., without employing any additional processing steps.

20 Claims, 12 Drawing Sheets

ELECTRICALLY PROGRAMMABLE FLOATING COMMON GATE CMOS DEVICE AND APPLICATIONS THEREOF

BACKGROUND

The present invention relates to programmable CMOS devices, and more specifically, programmable CMOS devices comprising an NFET and a PFET with a commonly connected floating gate for storing electrical charges and methods of operating the same.

A field effect transistor (FET) typically includes a source region and a drain region, with a channel region in between. The conductance of the channel region is controlled by the voltage on a conductive gate electrode which is separated from the channel region by an insulator layer, which is typically referred to as a gate dielectric. For an n-type FET (NFET), the source and drain regions are heavily doped with n-type dopants. For a p-type FET (PFET), the source and drain regions are doped with p-type dopants.

For an NFET, the channel conductance can be increased, that is the electron current flowing from source to drain can be increased, by biasing the gate electrode more positively relatively to its source region. Conversely, the channel conductance can be decreased, that is the electron current flowing from source to drain can be decreased, by biasing the gate electrode more negatively relatively to its source region. For a PFET, the channel conductance can be increased, that is, the hole current flowing from source to drain can be increased, by biasing the gate electrode more negatively relatively to its source region. The channel conductance can be decreased, that is, the hole current flowing from source to drain can be decreased, by biasing the gate electrode more positively relatively to its source region. The charge carrier flow between the source and the drain is referred to as the drain current.

For a typical FET, the gate current, i.e., the current flow between the gate electrode and the source, drain, or channel region, is orders of magnitude less than the current between the source and the drain. The gate current is controlled by tunneling processes. If the gate insulator is of sufficient thickness, tunneling is negligible and no current flows between the gate electrode and the source, drain, or channel region. In contrast, the gate current increases in a FET having a thin gate dielectric.

Referring to FIG. 1, the gate current and the drain current are shown as a function of a gate voltage, i.e., the voltage applied between the gate electrode and the source, at a fixed drain-to-source bias voltage of 6 V for a PFET having a 7 nm-thick gate oxide and a gate length of 0.65 µm. The gate current is caused by tunneling of avalanche hot electrons into the gate electrode.

Referring to FIG. 2, a schematic curve for the gate current illustrates that the dominant charge carriers contributing to the gate current of a PFET having a constant drain-to-source voltage are avalanche hot electrons in a low gate-to-source voltage mode, but are channel hot holes in a high gate-to-source voltage mode. The gate-to-source voltage at which a transition between the two modes occurs depends on the characteristics of the PFET.

Referring to FIG. 3, a schematic curve for the gate current illustrates that the dominant charge carriers contributing to the gate current of an NFET having a constant drain-to-source voltage are avalanche hot holes in a low gate-to-source voltage mode, but are channel hot electrons in a high gate-to-source voltage mode. The gate-to-source voltage at which a transition between the two modes occurs depends on the characteristics of the NFET.

The concept of flash memory was first described in F. Masuoka et al., "A new flash EEPROM cell using triple polysilicon technology," IEEE IEDM Technical Digest, p. 464, 1984. Today, most non-volatile memory products are flash memory. While such floating-gate devices can be programmed by injecting charge into the floating gate, these floating-gate programmable devices have specialized applications that require specific manufacturing processes. Typically, stand-alone non-volatile memory chips are designed with high memory capacity and low cost as primary objectives. These chips are made using special processes that are not compatible with standard logic processes. For instance, the first flash memory described by Masuoka et al. in 1984, mentioned above, employs three layers of polysilicon, while standard logic processes employ only one layer of polysilicon. In short, prior art floating gate memory devices require additional layers, and correspondingly, additional processing steps during the manufacturing process.

BRIEF SUMMARY

A programmable CMOS device includes a PFET and an NFET that have a common floating gate. Depending on the configuration, the programmable CMOS device can be programmed, erased, and re-programmed repeatedly. The programming, erasure, and/or reprogramming can be effected by injection of electrons and/or holes into the floating gate. The programmable CMOS device can be employed as a fuse or an antifuse, to program a floating gate of another device, and/or to function as a latch. The programmable CMOS device can be formed employing standard logic compatible processes, i.e., without employing any additional processing steps.

According to an aspect of the present invention, a semiconductor structure is provided, which includes an assembly of a PFET and an NFET in a series connection. A source/drain node of the PFET and a source/drain node of the NFET constitute a common node. A gate electrode of the PFET and a gate electrode of the NFET constitute a common floating gate configured to retain electrical charges therein.

According to another aspect of the present invention, a method of operating a semiconductor structure is provided. The method includes: providing an assembly of a PFET and an NFET in a series connection, wherein a source/drain node of the PFET and a source/drain node of the NFET constitute a common node, and a gate electrode of the PFET and a gate electrode of the NFET constitute a common floating gate configured to retain electrical charges therein; and injecting electrical charges through a gate dielectric of one of the PFET and the NFET into the common floating gate.

DETAILED DESCRIPTION

Figure 1:
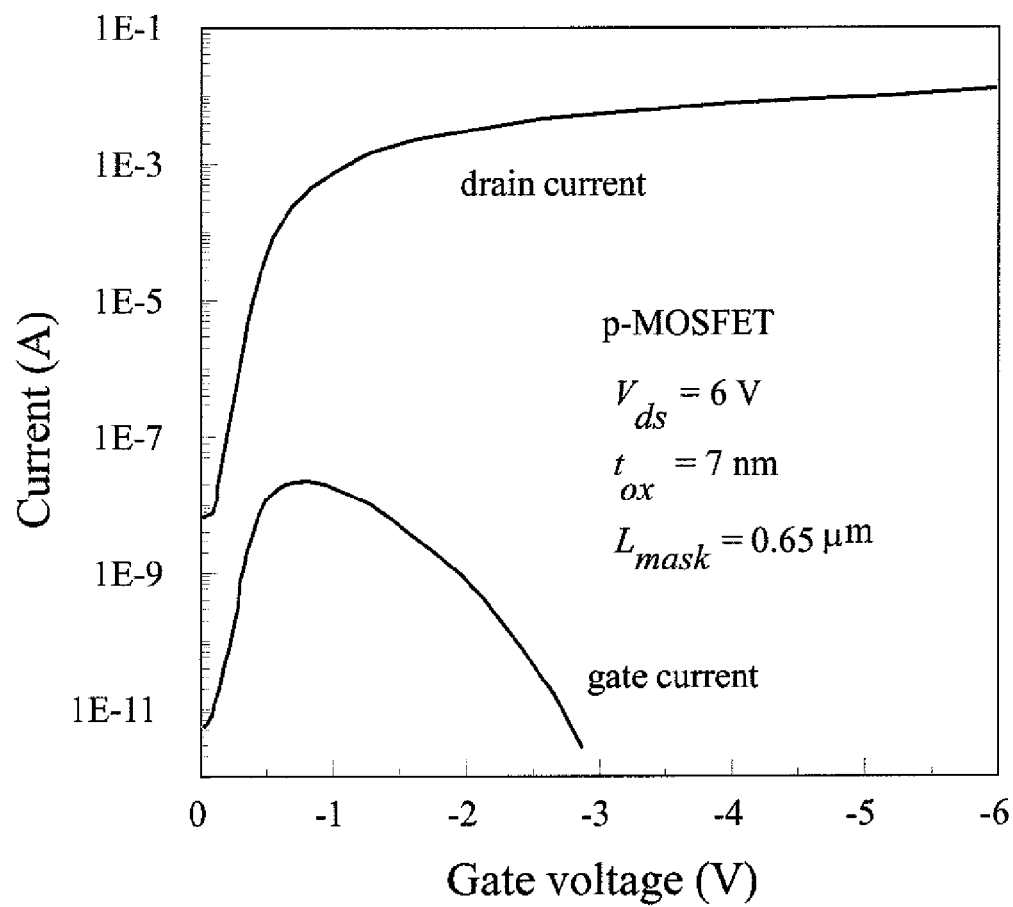
FIG. 1 is a graph showing the gate current and the drain current as a function of a gate voltage for a fixed drain-to-source bias voltage for a prior art non-floating gate PFET.
Figure 2:
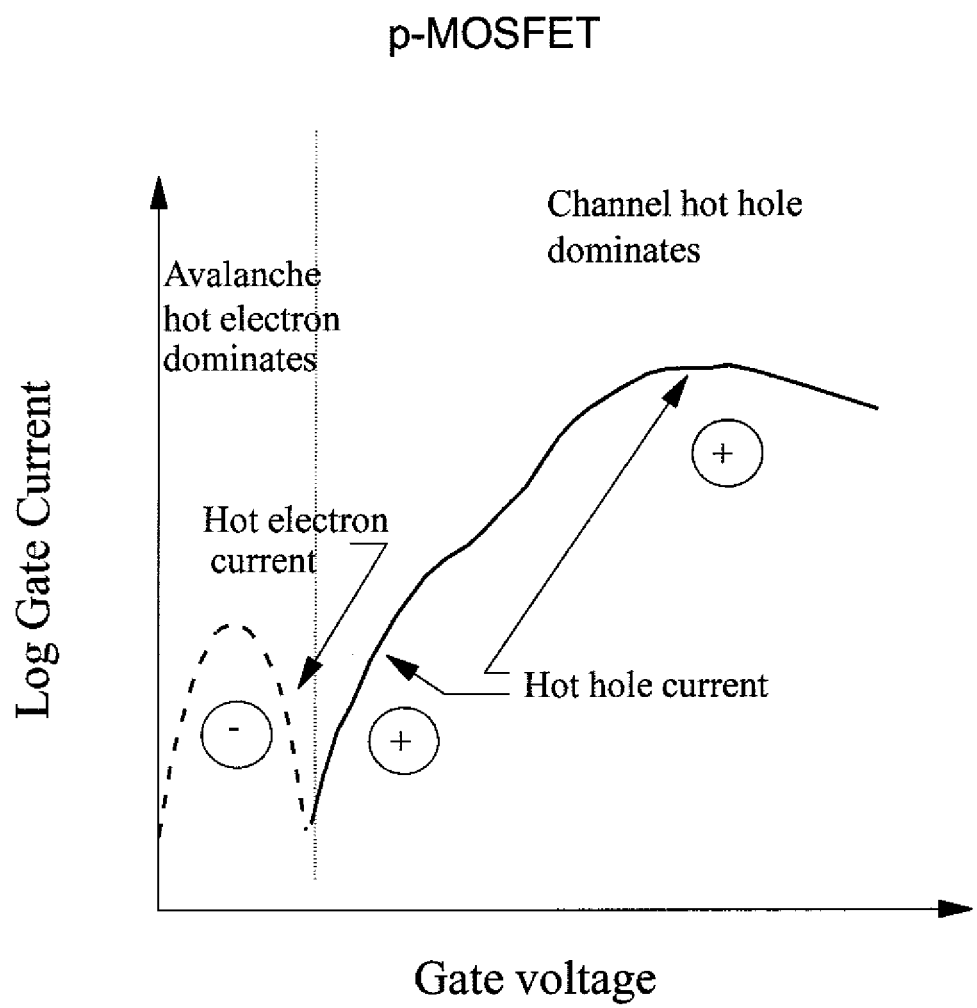
FIG. 2 is a schematic curve for the gate current of a prior art non-floating gate PFET having a constant drain-to-source bias voltage as a function of the gate voltage.
Figure 3:
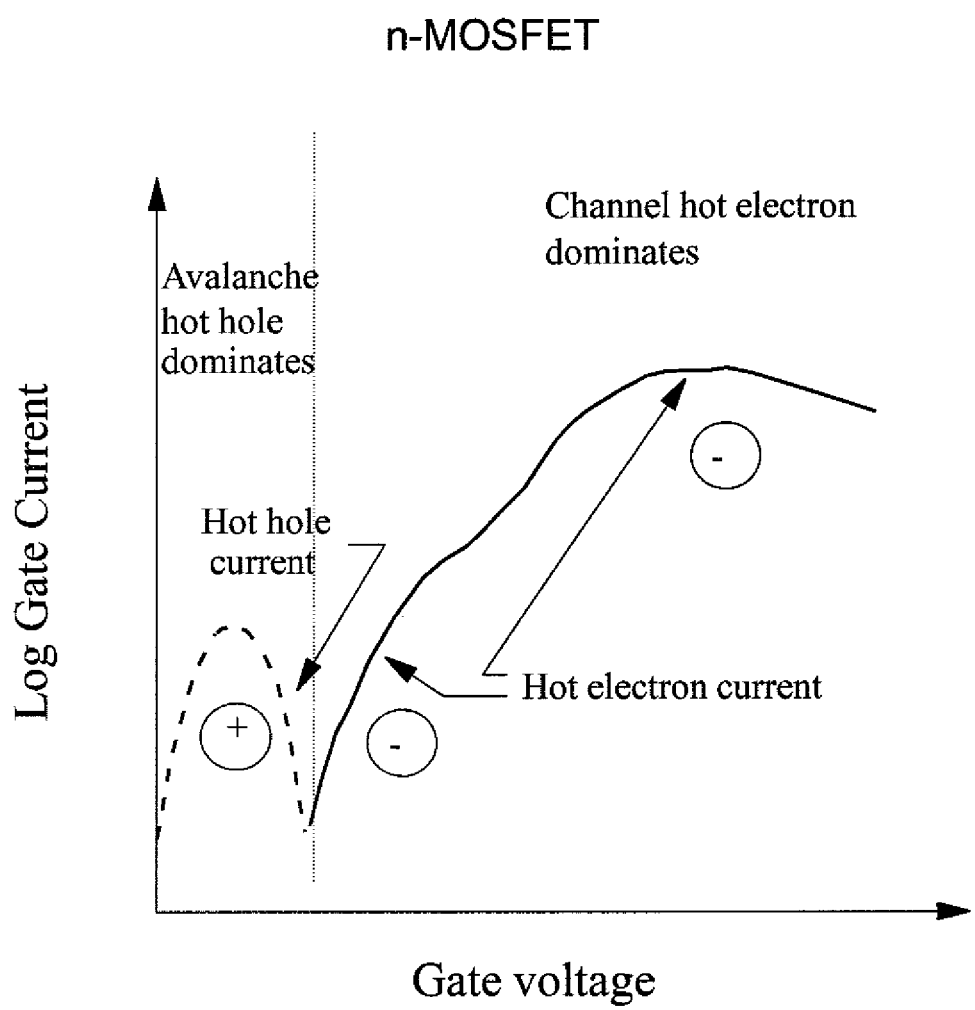
FIG. 3 is a schematic curve for the gate current of a prior art non-floating gate NFET having a constant drain-to-source bias voltage as a function of the gate voltage.

As stated above, the present invention relates to programmable CMOS devices comprising an NFET and a PFET with a commonly connected floating gate for storing electrical charges and methods of operating the same, which are now described in detail with accompanying figures. It is noted that like and corresponding elements mentioned herein and illustrated in the drawings are referred to by like reference numerals.

As used herein, if a first element is "electrically connected" to a second element, there exists an electrically conductive path between the first element and the second element so that the first element and the second element have the same voltage for the purpose of operation of any circuit involving the first element or the second element.

As used herein, a "source/drain" node of a field effect transistor refers to a node of a source region, a drain region, or a region configured to operate as a source region or a drain region depending on the polarity of applied voltages.

As used herein, a "PFET" or a "p-type FET" refers to a p-type field effect transistor including a p-doped source region and a p-doped drain region.

As used herein, an "NFET" or an "n-type FET" refers to an n-type field effect transistor including an n-doped source region and an n-doped drain region.

As used herein, an "enhancement mode" transistor refers to a field effect transistor including a channel having a doping of the opposite conductivity type as the doping of the source region and the drain region of the field effect transistor.

As used herein, a "depletion mode" transistor refers to a field effect transistor including a channel having a doping of the same conductivity type as the doping of the source region and the drain region of the field effect transistor.

As used herein, "output conductance" of a field effect transistor is a ratio of electrical current between a source region and a drain region of the field effect transistor to a voltage applied to across the source region and the drain region of the field effect transistor.

Figure 4:
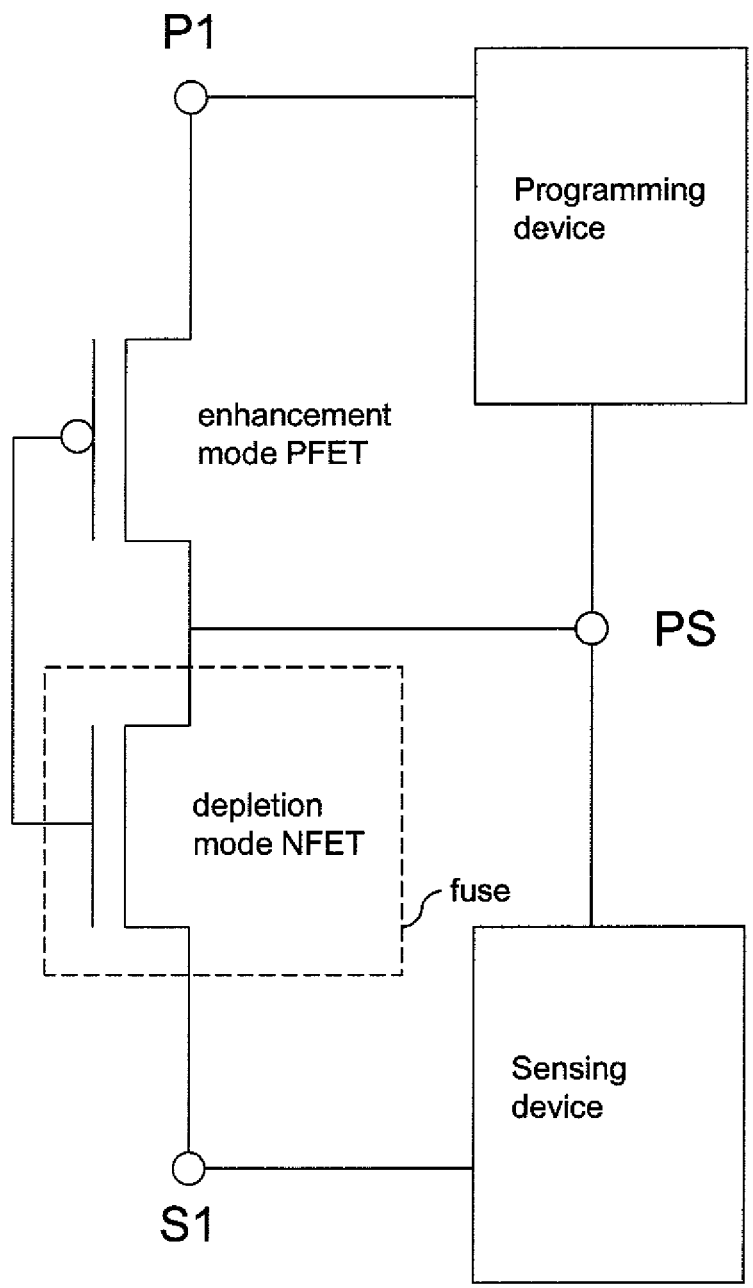
FIG. 4 is a circuit schematic for a first exemplary CMOS device according to a first embodiment of the present invention.

Referring to FIG. 4, a first exemplary complementary metal-oxide-semiconductor (CMOS) device according to a first embodiment of the present invention includes an assembly of a PFET and an NFET in a series connection. A first source/drain node of the PFET and a first source/drain node of the NFET are electrically connected to each other, thereby constituting a common node labeled "PS." A gate electrode of the PFET and a gate electrode of the NFET are electrically connected to each other and electrically floating, thereby constituting a common floating gate. The common floating gate is electrically floating, i.e., is configured to retain electrical charges therein with negligible or non-existent leakage current. Thus, the assembly of the PFET and the NFET is a floating-gate CMOS device.

The assembly of the PFET and the NFET has at least three externally accessible nodes (terminals), not counting any substrate biasing nodes (terminals) and/or well biasing nodes (terminals) that may be optionally added. A second source/drain node of the PFET that is not electrically connected to any source/drain node of the NFET is herein referred to as a "P1" node, or a first programming node. A second source/drain node of the NFET that is not electrically connected to any source/drain node of the PFET is herein referred to as a "S1" node, or a first sensing node. Each of the source/drain nodes can operate as a source node or a drain node depending on the electrical bias applied thereto.

A programming device is electrically connected to the common node PS and a second source/drain node of the PFET, i.e., the P1 node. The programming device is configured to induce injection of electrical charges of p-type, i.e., holes, into the common floating gate during operation. The programming device can include a voltage source or a current source. A sensing device is electrically connected to the common node PS and a second source/drain node of the NFET, i.e., the S1 node. The sensing device is configured to measure the output conductance of the NFET. The sensing device can include a voltage source that measures a current flow therethrough, or a current source that measures a required voltage to maintain the current flow.

The P1 node is a first programming node that is employed exclusively for programming. The PS node is the common node that functions as a second programming node during a programming step. The S1 node is a first sensing node that is employed exclusively for sensing. The PS node functions as a second sensing node during a sensing step.

In one embodiment, the PFET can be an enhancement mode PFET that is normally turned off, and the NFET can be a depletion mode NFET that is normally turned on. In the absence of any prior programming, therefore, the depletion mode NFET can function as an electrically programmable fuse that provides a high output conductance, i.e., a low resistance. A fuse refers to a two terminal device which is normally conducting or having some specified low resistance value, and can be electrically programmed to become non-conducting or having some specified high resistance value. If the sensing device applies a fixed sensing voltage, the depletion mode NFET allows conduction of a high current. Alternately, if the sensing device tries to maintain a fixed amount of sensing current, the voltage across the PS node and the S1 node converges to a low voltage. Thus, the high output conductance state of the depletion mode NFET as an electrically programmable fuse can be sensed before programming.

When the programming device induces a current flow through the enhancement mode PFET, for example, by applying a voltage bias across the P1 node and the PS node or by inducing a current flow through the enhancement mode PFET, the PFET is placed in an operational mode in which hot electron current caused by avalanche hot electrons dominate the gate current, i.e., the electrical current across the gate dielectric of the PFET. As electrons are injected into the common floating gate, the common floating gate accumulates negative electrical charges, thereby driving the voltage at the common floating gate negative. The injection of electrons can be effected by applying a relatively large voltage bias between the source and the drain of the PFET, i.e., by applying the voltage bias across the P1 node and the PS node. The polarity of the voltage bias can be either way. Under such conditions, avalanche hot electron injection into the common floating gate takes place in the PFET through the gate dielectric of the PFET. Avalanche hot electron injection in a PFET can be very efficient, as discussed in C. Hsu et al. "A high speed, low power p-channel Flash EEPROM using silicon rich oxide as tunneling dielectric," Extended abstract of the 1992 International Conference on Solid State Devices and Materials, Tsukaba, pp. 140-142.

As electrons accumulate in the common floating gate of the assembly of the PFET and the NFET, the voltage at the common floating gate becomes negative enough to turn off the depletion mode NFET. In this state, the depletion mode NFET as an electrically programmable fuse is in a programmed state having a low output conductance, i.e., a high resistance. If the sensing device applies a fixed sensing voltage, the depletion mode NFET allows conduction of a low current. Alternately, if the sensing device tries to maintain a fixed amount of sensing current, the voltage across the PS node and the S1 node converges to a high voltage. Thus, the low output conductance state of the depletion mode NFET as an electrically programmable fuse can be sensed after programming.

The state of the fuse is determined by the presence or absence of trapped negative electrical charges, i.e., electrons, in the common floating gate. The presence or absence of the trapped negative electrical charges can be detected by differences in the measured value of the output conductance without disturbing the electrical charges in the common floating gate. The sensing condition is determined to eliminate or minimize injection of any charges into the common floating gate through the gate dielectric of the depletion mode NFET.

Thus, the fuse is written (programmed to become nonconducting or to have high resistance value) by biasing the PFET to cause avalanche hot electron injection into the common floating gate. The electrons stored in the common floating gate turn off the NFET, causing the fuse to change from a low resistance state to a high resistance state. Because the electrical charges trapped in the common floating gate do not dissipate in time, the first exemplary semiconductor device can be employed as a programmable non-volatile memory device, i.e., a fuse type one-time programmable read only memory (OTP-ROM) or an OTP-ROM having a high output conductance before programming and a low output conductance after programming.

The use of the first exemplary CMOS device as an OTP-ROM is based on the operation of the NFET as a non-volatile memory element in which its channel conductance can be programmed by charge injection into the common floating gate from the PFET. The two source/drain nodes of the NFET, i.e., the S1 node and the PS node of the NFET, function as two terminals of the fuse for sensing purposes. The two source/drain nodes of the PFET, i.e., the P1 node and the PS node of the PFET, function as two terminals of the fuse for programming purposes.

The first exemplary CMOS device can be implemented in any CMOS manufacturing process including, but not limited to, a bulk CMOS manufacturing process, a semiconductor-on-insulator (SOI) CMOS manufacturing process, and a finFET manufacturing process. Preferably, the gate dielectrics should be sufficiently thick to meet the retention time requirement for electrical charges stored in the common floating gate, i.e., the electrical charge stored in the common floating gate does not leak out at a rate higher than an upper limit.

Figure 5:
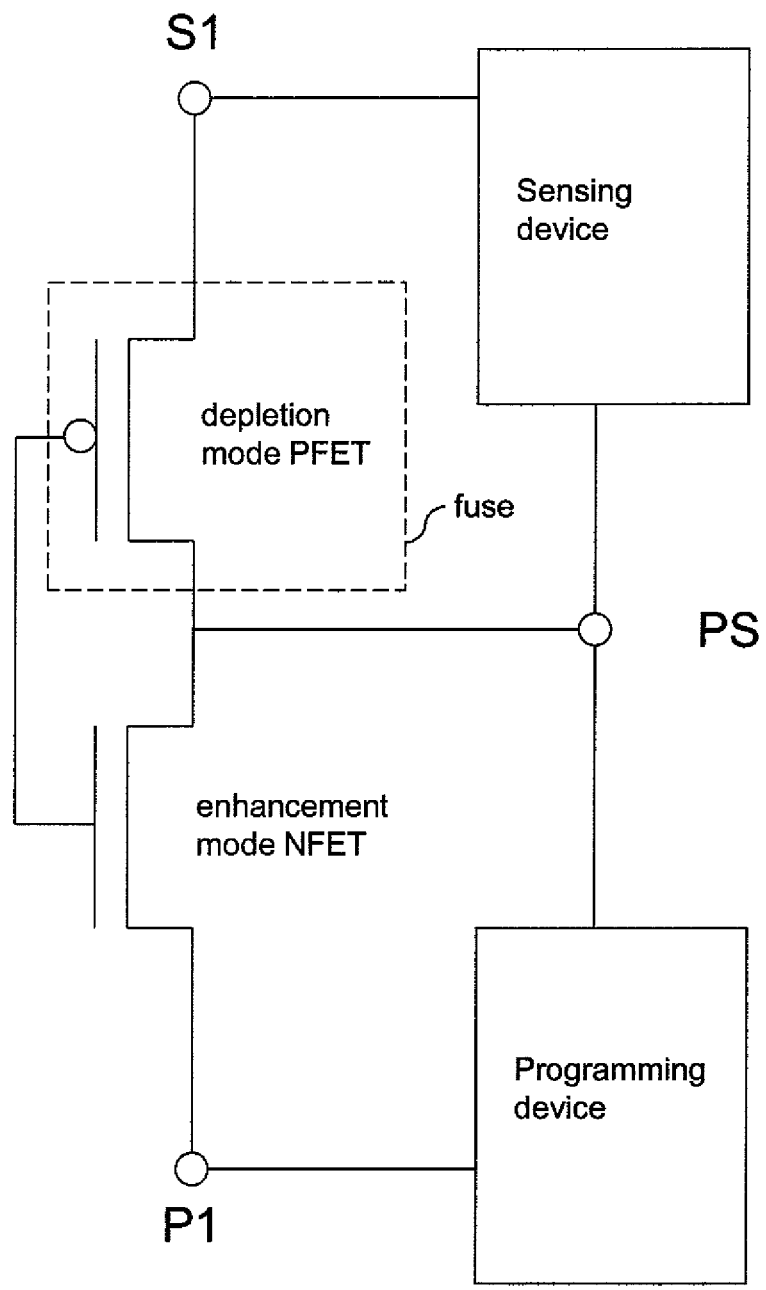
FIG. 5 is a circuit schematic for a second exemplary CMOS device according to a second embodiment of the present invention.

Referring to FIG. 5, a second exemplary CMOS device according to a second embodiment of the present invention includes an assembly of a PFET and an NFET in a series connection. A first source/drain node of the PFET and a first source/drain node of the NFET are electrically connected to each other, thereby constituting a common node labeled "PS." A gate electrode of the PFET and a gate electrode of the NFET are electrically connected to each other and electrically floating, thereby constituting a common floating gate. The common floating gate is electrically floating, and consequently, the assembly of the PFET and the NFET is a floating-gate CMOS device.

The assembly of the PFET and the NFET has at least three externally accessible nodes (terminals), not counting any substrate biasing nodes (terminals) and/or well biasing nodes (terminals) that may be optionally added. A second source/drain node of the NFET that is not electrically connected to any source/drain node of the PFET is herein referred to as a "P1" node, or a first programming node. A second source/drain node of the PFET that is not electrically connected to any source/drain node of the NFET is herein referred to as a "S1" node, or a first sensing node. Each of the source/drain nodes can operate as a source node or a drain node depending on the electrical bias applied thereto.

A programming device is electrically connected to the common node PS and a second source/drain node of the NFET, i.e., the P1 node. The programming device is configured to induce injection of electrical charges of p-type, i.e., holes, into the common floating gate during operation. The programming device can include a voltage source or a current source. A sensing device is electrically connected to the common node PS and a second source/drain node of the PFET, i.e., the S1 node. The sensing device is configured to measure the output conductance of the PFET. The sensing device can include a voltage source that measures a current flow therethrough, or a current source that measures a required voltage to maintain the current flow.

The P1 node is a first programming node that is employed exclusively for programming. The PS node is the common node that functions as a second programming node during a programming step. The S1 node is a first sensing node that is employed exclusively for sensing. The PS node functions as a second sensing node during a sensing step.

In one embodiment, the NFET can be an enhancement mode NFET that is normally turned off, and the PFET can be a depletion mode PFET that is normally turned on. In the absence of any prior programming, therefore, the depletion mode PFET can function as an electrically programmable fuse that provides a high output conductance, i.e., a low resistance. If the sensing device applies a fixed sensing voltage, the depletion mode PFET allows conduction of a high current. Alternately, if the sensing device tries to maintain a fixed amount of sensing current, the voltage across the PS node and the S1 node converges to a low voltage. Thus, the high output conductance state of the depletion mode PFET as an electrically programmable fuse can be sensed before programming.

When the programming device induces a current flow through the enhancement mode NFET, for example, by applying a voltage bias across the P1 node and the PS node or by inducing a current flow through the enhancement mode NFET, the NFET is placed in an operational mode in which hot hole current caused by avalanche hot holes dominate the gate current, i.e., the electrical current across the gate dielectric of the NFET. As holes are injected into the common floating gate, the common floating gate accumulates positive electrical charges, thereby driving the voltage at the common floating gate positive. The injection of holes can be effected by applying a relatively large voltage bias between the source and the drain of the NFET, i.e., by applying the voltage bias across the P1 node and the PS node. The polarity of the voltage bias can be either way. Under such conditions, avalanche hot hole injection into the common floating gate takes place in the NFET through the gate dielectric of the NFET. Avalanche hot hole injection in an NFET can occur when the gate-to-source voltage of the NFET is small or when the gate is biased negatively relative to the source, as illustrated schematically in S. Yamada et al. "A self-convergence erasing scheme for a simple stacked gate flash EEPROM," 1991 IEDM, pp. 307-310.

As holes accumulate in the common floating gate of the assembly of the PFET and the NFET, the voltage at the common floating gate becomes positive enough to turn off the depletion mode PFET. In this state, the depletion mode PFET as an electrically programmed fuse is in a programmed state having a low output conductance, i.e., a high resistance. If the sensing device applies a fixed sensing voltage, the depletion mode PFET allows conduction of a low current. Alternately, if the sensing device tries to maintain a fixed amount of sensing current, the voltage across the PS node and the S1 node converges to a high voltage. Thus, the low output conductance state of the depletion mode PFET as an electrically programmable fuse can be sensed after programming.

The state of the fuse is determined by the presence or absence of trapped positive electrical charges, i.e., holes, in the common floating gate. The presence or absence of the trapped positive electrical charges can be detected by differences in the measured value of the output conductance without disturbing the electrical charges in the common floating gate. The sensing condition is determined to eliminate or minimize injection of any charges into the common floating gate through the gate dielectric of the depletion mode PFET.

Thus, the fuse is programmed by biasing the NFET to cause avalanche hot hole injection into the common floating gate. The holes stored in the common floating gate turn off the PFET, causing the fuse to change from a low resistance state to a high resistance state. Because the electrical charges trapped in the common floating gate do not dissipate in time, the second exemplary semiconductor device can be employed as a programmable non-volatile memory device.

The use of the second exemplary CMOS device as an OTP-ROM is based on the operation of the PFET as a non-volatile memory element in which its channel conductance can be programmed by charge injection into the common floating gate from the NFET. The two source/drain nodes of the PFET, i.e., the S1 node and the PS node of the PFET, function as two terminals of the fuse for sensing purposes. The two source/drain nodes of the NFET, i.e., the P1 node and the PS node of the NFET, function as two terminals of the fuse for programming purposes.

Like the first exemplary CMOS device, the second exemplary CMOS device can be implemented in any CMOS manufacturing process including, but not limited to, a bulk CMOS manufacturing process, a semiconductor-on-insulator (SOD) CMOS manufacturing process, and a finFET manufacturing process. Because the leakage current from the common floating gate decreases with the thickness of the gate dielectrics, the thickness the gate dielectrics should be sufficiently thick to meet the retention time requirement for electrical charges stored in the common floating gate. The thickness of the gate dielectrics is preferably greater than 1.5 nm, and more preferably larger than 4 nm.

Figure 6:
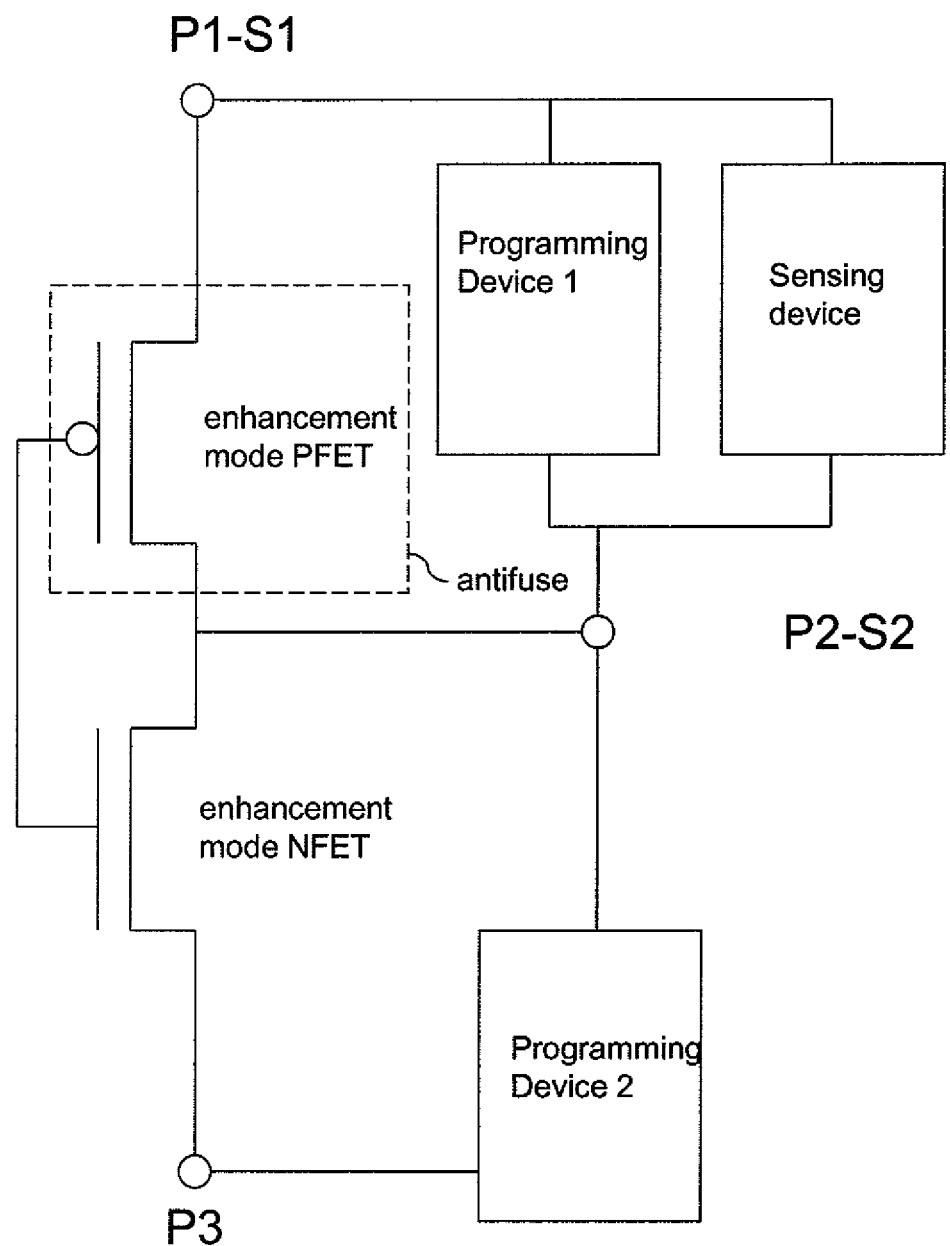
FIG. 6 is a circuit schematic for a third exemplary CMOS device according to a third embodiment of the present invention.

Referring to FIG. 6, a third exemplary CMOS device according to a third embodiment of the present invention includes an assembly of a PFET and an NFET in a series connection. A first source/drain node of the PFET and a first source/drain node of the NFET are electrically connected to each other, thereby constituting a common node labeled "P2-S2," denoting a second programming/second sensing node. A gate electrode of the PFET and a gate electrode of the NFET are electrically connected to each other and electrically floating, thereby constituting a common floating gate. The common floating gate is electrically floating, i.e., is configured to retain electrical charges therein with negligible or non-existent leakage current. Thus, the assembly of the PFET and the NFET is a floating-gate CMOS device.

The assembly of the PFET and the NFET has at least three externally accessible nodes (terminals), not counting any substrate biasing nodes (terminals) and/or well biasing nodes (terminals) that may be optionally added. A second source/drain node of the PFET that is not electrically connected to any source/drain node of the NFET is herein referred to as a "P1-S1" node, or a first programming/first sensing node. A second source/drain node of the NFET that is not electrically connected to any source/drain node of the PFET is herein referred to as a "P3" node, or a third programming node. Each of the source/drain nodes can operate as a source node or a drain node depending on the electrical bias applied thereto.

A first programming device is electrically connected to the common node P2-S2 and a second source/drain node of the PFET, i.e., the P1-S1 node. The first programming device is configured to induce injection of electrical charges of n-type, i.e., electrons, into the common floating gate during operation. The first programming device can include a voltage source or a current source.

A second programming device is electrically connected to the common node P2-S2 and a second source/drain node of the NFET, i.e., the P3 node. The second programming device is configured to induce injection of electrical charges of p-type, i.e., holes, into the common floating gate during operation. The second programming device can include a voltage source or a current source.

A sensing device is electrically connected to the common node P2-S2 and the second source/drain node of the PFET, i.e., the P1-S1 node. The sensing device is configured to measure the output conductance of the PFET. The sensing device can include a voltage source that measures a current flow therethrough, or a current source that measures a required voltage to maintain the current flow. During the sensing, the first programming device is put into a high impedance mode in order not to affect the measurement of the output conductance of the PFET. The first programming device is electrically connected to the common node, i.e., the P2-S2 node, and the second source/drain node of the PFET, i.e., the P1-S1 node, in a parallel connection with the sensing device.

The third exemplary CMOS device can function as a programmable erasable memory device, of which the state is determined by the type of electrical charges stored in the common floating gate. The combination of the P1-S1 node and the P2-S2 node can be employed to inject electrons into the common floating gate during a programming operation. The combination of the P2-S2 node and the P3 node can be employed to inject holes into the common floating gate during an erase operation. The combination of the P1-S1 node and the P2-S2 node can be employed to measure the output conductance of the PFET to detect the type of charges stored in the common floating gate.

In one embodiment, the PFET can be an enhancement mode PFET that is normally turned off, and the NFET can be an enhancement mode NFET that is normally turned off. In the absence of any prior programming, therefore, the enhancement mode PFET can function as an electrically programmable antifuse that provides a low output conductance, i.e., a high resistance. An antifuse refers to a two terminal device which is normally non-conducting or having some specified high resistance value, and can be electrically programmed to become conducting or having some specified low resistance value. If the sensing device applies a fixed sensing voltage, the enhancement mode PFET allows conduction of little current. Alternately, if the sensing device tries to maintain a fixed amount of sensing current, the voltage across the P1-S1 node and the P2-S2 node converges to a high voltage. Thus, the low output conductance state of the enhancement mode PFET as an electrically programmable antifuse can be sensed before programming.

To program the antifuse, the first programming device and the enhancement mode PFET are employed to inject electrons into the common floating gate. Specifically, when the first programming device induces a current flow through the enhancement mode PFET, for example, by applying a voltage bias across the P1-S1 node and the P2-S2 node or by inducing a current flow through the enhancement mode PFET, the PFET is placed in an operational mode in which hot electron current caused by avalanche hot electrons dominate the gate current of the PFET. As electrons are injected into the common floating gate, the common floating gate accumulates negative electrical charges, thereby driving the voltage at the common floating gate negative. The injection of electrons can be effected by applying a relatively large voltage bias between the source and the drain of the PFET, i.e., by applying the voltage bias across the P1-S1 node and the P2-S2 node. The polarity of the voltage bias can be either way. Under such conditions, avalanche hot electron injection into the common floating gate takes place in the PFET through the gate dielectric of the PFET.

As electrons accumulate in the common floating gate of the assembly of the PFET and the NFET, the voltage at the common floating gate becomes negative enough to turn on the enhancement mode PFET. In this state, the enhancement mode PFET as an electrically programmable antifuse is in a programmed state having a high output conductance, i.e., a low resistance. If the sensing device applies a fixed sensing voltage, the enhancement mode PFET allows conduction of a high current. Alternately, if the sensing device tries to maintain a fixed amount of sensing current, the voltage across the P1-S1 node and the P2-S2 node converges to a low voltage. Thus, the high output conductance state of the enhancement mode PFET as an electrically programmable antifuse can be sensed after programming.

Erasure, or anti-programming, of the antifuse can be effected with the second programming device and the enhancement mode NFET. Specifically, when the second programming device induces a current flow through the enhancement mode NFET, for example, by applying a voltage bias across the P2-S2 node and the P3 node or by inducing a current flow through the enhancement mode NFET, the NFET is placed in an operational mode in which hot hole current caused by avalanche hot holes dominate the gate current of the NFET. As holes are injected into the common floating gate, the common floating gate accumulates positive electrical charges, thereby initially cancelling the stored negative charges, i.e., the charges of the stored electrons, and subsequently driving the voltage at the common floating gate positive. The injection of holes can be effected by applying a relatively large voltage bias between the source and the drain of the NFET, i.e., by applying the voltage bias across the P2-S2 node and the P3 node. The polarity of the voltage bias can be either way. Under such conditions, avalanche hot hole injection into the common floating gate takes place in the NFET through the gate dielectric of the NFET.

Once sufficient amount of holes accumulate in the common floating gate of the assembly of the PFET and the NFET, the voltage at the common floating gate becomes positive enough to turn off the enhancement mode PFET. In this state, the enhancement mode PFET as an electrically programmed antifuse is in an erased state, i.e., an anti-programmed state, having a low output conductance, i.e., a high resistance. If the sensing device applies a fixed sensing voltage, the enhancement mode PFET allows conduction of a low current. Alternately, if the sensing device tries to maintain a fixed amount of sensing current, the voltage across the P1-S1 node and the P2-S2 node converges to a high voltage. Thus, the low output conductance state of the enhancement mode PFET as an electrically programmable antifuse can be sensed after erasure or anti-programming.

The antifuse can be repeatedly programmed and erased. The number of programming/erasing events that can be performed on the assembly of the PFET and the NFET is limited only by the durability of the gate dielectrics of the PFET and the NFET. The thickness of the gate dielectrics of the PFET and the NFET is selected to provide sufficient retention time after programming, e.g., thicker than 1.5 nm, and preferably thicker than 4 nm. Thus, the gate dielectrics are typically sufficiently thick to enable at least 10 thousand programming/erasing cycles, and preferably above 1 million programming/erasing cycles.

The state of the antifuse is determined by the absence of trapped electrical charges or by the type of trapped electrical charges in the common floating gate of the assembly of the PFET and the NFET. The state of the antifuse can be detected by differences in the measured value of the output conductance without disturbing the electrical charges in the common floating gate. If there is no trapped charge (as in the case of a pre-programming state) or if the trapped charges are positive charges, i.e., holes (as in the case of an erased/anti-programmed state), the output conductance of the PFET is low, i.e., the PFET is turned off during sensing. If the trapped charges are negative charges (as in the case of a programmed state), the output conductance of the PFET is high, i.e., the PFET is turned on during sensing. The sensing condition is determined to eliminate or minimize injection of any charges into the common floating gate through the gate dielectric of the enhancement mode PFET.

Thus, the antifuse is programmed by biasing the PFET to cause avalanche hot electron injection into the common floating gate. The electrons stored in the common floating gate turn on the PFET, causing the antifuse to change from a high resistance state to a low resistance state. The antifuse is erased, or anti-programmed, by biasing the NFET to cause avalanche hot hole injection into the common floating gate. The holes stored in the common floating gate turn off the PFET, causing the antifuse to change from a low resistance state to a high resistance state. Because the electrical charges trapped in the common floating gate do not dissipate in time, the third exemplary semiconductor device can be employed as a programmable non-volatile memory device.

The use of the third exemplary CMOS device as an erasable electrically programmable read only memory (EEPROM) is based on the operation of the PFET as a non-volatile memory element in which its channel conductance, i.e., the output conductance, can be programmed by negative charge injection into the common floating gate from the PFET and erased by positive charge injection into the common floating gate from the NFET. The two source/drain nodes of the PFET, i.e., the P1-S1 node and the P2-S2 node, function as two terminals of the EEPROM or the programmable and erasable antifuse for programming and sensing purposes. The two source/drain nodes of the NFET, i.e., the P2-S2 node and the P3 node, function as two terminals of the EEPROM for erasing or anti-programming purposes.

Like the first and second exemplary CMOS devices, the third exemplary CMOS device can be implemented in any CMOS manufacturing process including, but not limited to, a bulk CMOS manufacturing process, a semiconductor-on-insulator (SOI) CMOS manufacturing process, and a finFET manufacturing process. Because the leakage current from the common floating gate decreases with the thickness of the gate dielectrics, the thickness the gate dielectrics should be sufficiently thick to meet the retention time requirement for electrical charges stored in the common floating gate. The thickness of the gate dielectrics is preferably greater than 1.5 nm, and more preferably larger than 4 mm In variations of the third exemplary CMOS device, a depletion mode PFET may substitute the enhancement mode PFET and/or a depletion mode NFET may substitute the enhancement mode NFET provided that appropriate operational parameters are adjusted accordingly.

Figure 7:
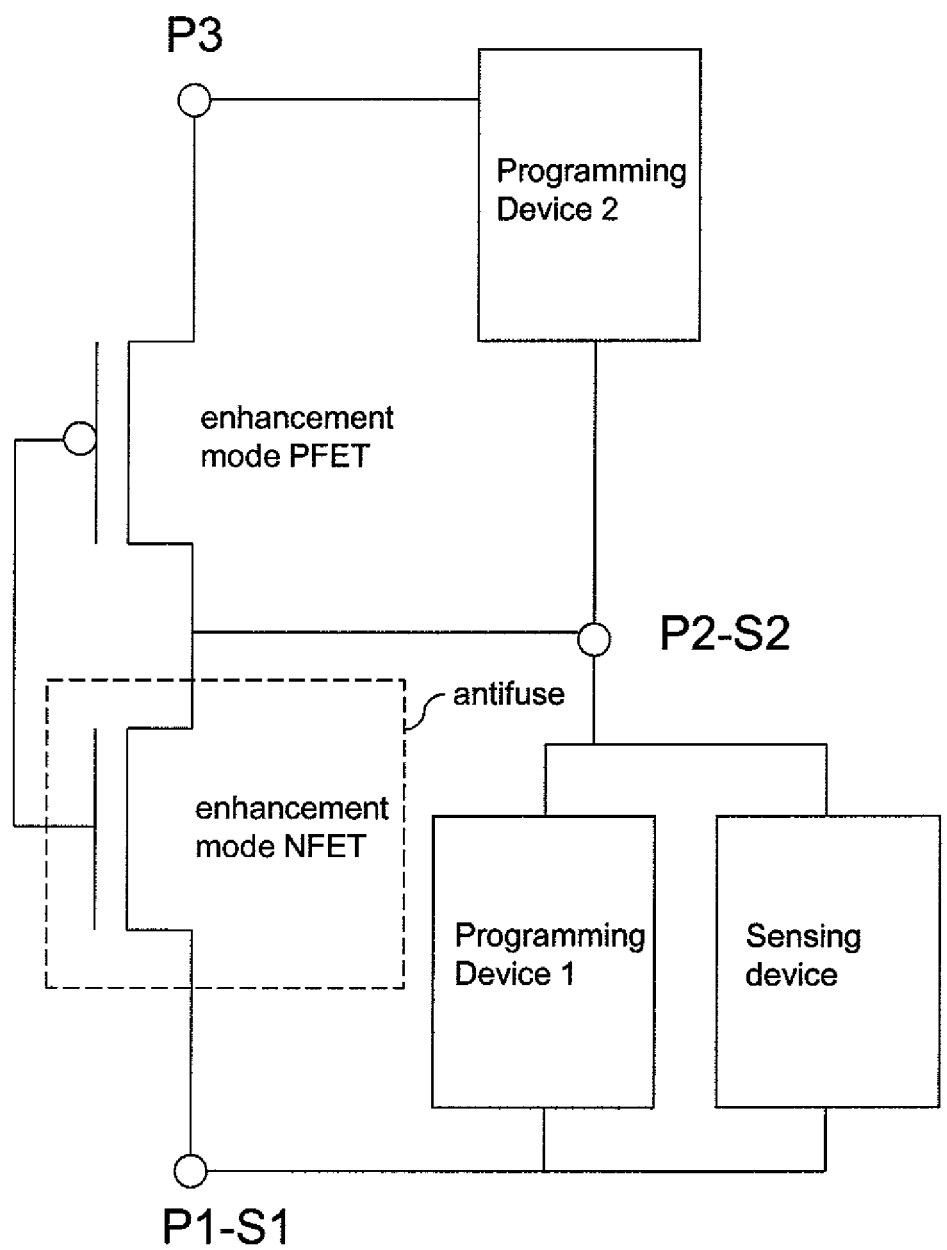
FIG. 7 is a circuit schematic for a fourth exemplary CMOS device according to a fourth embodiment of the present invention.

Referring to FIG. 7, a fourth exemplary CMOS device according to a fourth embodiment of the present invention employs the same operational principles of the third exemplary CMOS device with the modification that a sensing device is electrically connected to two source/drain terminals of the enhancement mode NFET.

A first source/drain node of the PFET and a first source/drain node of the NFET are electrically connected to each other, thereby constituting a common node labeled "P2-S2," denoting a second programming/second sensing node. A gate electrode of the PFET and a gate electrode of the NFET are electrically connected to each other and electrically floating, thereby constituting a common floating gate. The common floating gate is electrically floating, i.e., is configured to retain electrical charges therein with negligible or non-existent leakage current. Thus, the assembly of the PFET and the NFET is a floating-gate CMOS device.

The assembly of the PFET and the NFET has at least three externally accessible nodes (terminals), not counting any substrate biasing nodes (terminals) and/or well biasing nodes (terminals) that may be optionally added. A second source/drain node of the NFET that is not electrically connected to any source/drain node of the PFET is herein referred to as a "P1-S1" node, or a first programming/first sensing node. A second source/drain node of the PFET that is not electrically connected to any source/drain node of the NFET is herein referred to as a "P3" node, or a third programming node. Each of the source/drain nodes can operate as a source node or a drain node depending on the electrical bias applied thereto.

A first programming device is electrically connected to the common node P2-S2 and a second source/drain node of the PFET, i.e., the P1-S1 node. The first programming device is configured to induce injection of electrical charges of p-type, i.e., holes, into the common floating gate during operation. The first programming device can include a voltage source or a current source.

A second programming device is electrically connected to the common node P2-S2 and a second source/drain node of the NFET, i.e., the P3 node. The second programming device is configured to induce injection of electrical charges of n-type, i.e., electrons, into the common floating gate during operation. The second programming device can include a voltage source or a current source.

A sensing device is electrically connected to the common node P2-S2 and the second source/drain node of the NFET, i.e., the P1-S1 node. The sensing device is configured to measure the output conductance of the NFET. The sensing device can include a voltage source that measures a current flow therethrough, or a current source that measures a required voltage to maintain the current flow. During the sensing, the first programming device is put into a high impedance mode in order not to affect the measurement of the output conductance of the NFET. The first programming device is electrically connected to the common node, i.e., the P2-S2 node, and the second source/drain node of the NFET, i.e., the P1-S1 node, in a parallel connection with the sensing device.

The fourth exemplary CMOS device can function as a programmable erasable memory device, of which the state is determined by the type of electrical charges stored in the common floating gate. The combination of the P1-S1 node and the P2-S2 node can be employed to inject holes into the common floating gate during a programming operation. The combination of the P2-S2 node and the P3 node can be employed to inject electrons into the common floating gate during an erase operation. The combination of the P1-S1 node and the P2-S2 node can be employed to measure the output conductance of the NFET to detect the type of charges stored in the common floating gate.

In one embodiment, the PFET can be an enhancement mode PFET that is normally turned off, and the NFET can be an enhancement mode NFET that is normally turned off. In the absence of any prior programming, therefore, the enhancement mode NFET can function as an electrically programmable antifuse that provides a low output conductance, i.e., a high resistance. If the sensing device applies a fixed sensing voltage, the enhancement mode NFET allows conduction of little current. Alternately, if the sensing device tries to maintain a fixed amount of sensing current, the voltage across the P1-S1 node and the P2-S2 node converges to a high voltage. Thus, the low output conductance state of the enhancement mode NFET as an electrically programmable antifuse can be sensed before programming.

To program the antifuse, the first programming device and the enhancement mode NFET are employed to inject holes into the common floating gate. Specifically, when the first programming device induces a current flow through the enhancement mode NFET, for example, by applying a voltage bias across the P1-S1 node and the P2-S2 node or by inducing a current flow through the enhancement mode NFET, the NFET is placed in an operational mode in which hot hole current caused by avalanche hot holes dominate the gate current of the NFET. As holes are injected into the common floating gate, the common floating gate accumulates positive electrical charges, thereby driving the voltage at the common floating gate positive. The injection of holes can be effected by applying a relatively large voltage bias between the source and the dram of the NFET, i.e., by applying the voltage bias across the P1-S1 node and the P2-S2 node. The polarity of the voltage bias can be either way. Under such conditions, avalanche hot hole injection into the common floating gate takes place in the NFET through the gate dielectric of the NFET.

As holes accumulate in the common floating gate of the assembly of the PFET and the NFET, the voltage at the common floating gate becomes positive enough to turn on the enhancement mode NFET. In this state, the enhancement mode NFET as an electrically programmable antifuse is in a programmed state having a high output conductance, i.e., a low resistance. If the sensing device applies a fixed sensing voltage, the enhancement mode NFET allows conduction of a high current. Alternately, if the sensing device tries to maintain a fixed amount of sensing current, the voltage across the P1-S1 node and the P2-S2 node converges to a low voltage. Thus, the high output conductance state of the enhancement mode NFET as an electrically programmable antifuse can be sensed after programming.

Erasure, or anti-programming, of the antifuse can be effected with the second programming device and the enhancement mode PFET. Specifically, when the second programming device induces a current flow through the enhancement mode PFET, for example, by applying a voltage bias across the P2-S2 node and the P3 node or by inducing a current flow through the enhancement mode PFET, the PFET is placed in an operational mode in which hot electron current caused by avalanche hot electrons dominate the gate current of the PFET. As electrons are injected into the common floating gate, the common floating gate accumulates negative electrical charges, thereby initially cancelling the stored positive charges, i.e., the charges of the stored holes, and subsequently driving the voltage at the common floating gate negative. The injection of electrons can be effected by applying a relatively large voltage bias between the source and the drain of the PFET, i.e., by applying the voltage bias across the P2-S2 node and the P3 node. The polarity of the voltage bias can be either way. Under such conditions, avalanche hot electron injection into the common floating gate takes place in the PFET through the gate dielectric of the PFET.

As electrons accumulate in the common floating gate of the assembly of the PFET and the NFET, the voltage at the common floating gate becomes negative enough to turn off the enhancement mode NFET. In this state, the enhancement mode NFET as an electrically programmed antifuse is in an erased state, i.e., an anti-programmed state, having a low output conductance, i.e., a high resistance. If the sensing device applies a fixed sensing voltage, the enhancement mode NFET allows conduction of a low current. Alternately, if the sensing device tries to maintain a fixed amount of sensing current, the voltage across the P1-S1 node and the P2-S2 node converges to a high voltage. Thus, the low output conductance state of the enhancement mode NFET as an electrically programmable antifuse can be sensed after erasure or anti-programming.

The antifuse can be repeatedly programmed and erased in a manner similar to the antifuse of the third exemplary CMOS device. The state of the antifuse is determined by the absence of trapped electrical charges or by the type of trapped electrical charges in the common floating gate of the assembly of the PFET and the NFET. The state of the antifuse can be detected by differences in the measured value of the output conductance without disturbing the electrical charges in the common floating gate. If there is no trapped charge (as in the case of a pre-programming state) or if the trapped charges are negative charges, i.e., electrons (as in the case of an erased/anti-programmed state), the output conductance of the NFET is low, i.e., the NFET is turned off during sensing. If the trapped charges are positive charges (as in the case of a programmed state), the output conductance of the NFET is high, i.e., the NFET is turned on during sensing. The sensing condition is determined to eliminate or minimize injection of any charges into the common floating gate through the gate dielectric of the enhancement mode NFET.

Thus, the antifuse is programmed by biasing the NFET to cause avalanche hot hole injection into the common floating gate. The holes stored in the common floating gate turn on the NFET, causing the antifuse to change from a high resistance state to a low resistance state. The antifuse is erased, or anti-programmed, by biasing the PFET to cause avalanche hot electron injection into the common floating gate. The electrons stored in the common floating gate turn off the NFET, causing the antifuse to change from a low resistance state to a high resistance state. Because the electrical charges trapped in the common floating gate do not dissipate in time, the fourth exemplary semiconductor device can be employed as a programmable non-volatile memory device.

The use of the fourth exemplary CMOS device as an erasable electrically programmable read only memory (EEPROM) is based on the operation of the NFET as a non-volatile memory element in which its channel conductance, i.e., the output conductance, can be programmed by positive charge injection into the common floating gate from the NFET and erased by negative charge injection into the common floating gate from the PFET. The two source/drain nodes of the NFET, i.e., the P1-S1 node and the P2-S2 node, function as two terminals of the EEPROM or the programmable and erasable antifuse for sensing purposes. The two source/drain nodes of the PFET, i.e., the P2-S2 node and the P3 node, function as two terminals of the EEPROM for erasing or anti-programming purposes.

Like the first, second, and third exemplary CMOS devices, the fourth exemplary CMOS device can be implemented in any CMOS manufacturing process including, but not limited to, a bulk CMOS manufacturing process, a semiconductor-on-insulator (SOI) CMOS manufacturing process, and a finFET manufacturing process. Because the leakage current from the common floating gate decreases with the thickness of the gate dielectrics, the thickness the gate dielectrics should be sufficiently thick to meet the retention time requirement for electrical charges stored in the common floating gate. The thickness of the gate dielectrics is preferably greater than 1.5 nm, and more preferably larger than 4 nm. In variations of the fourth exemplary CMOS device, a depletion mode PFET may substitute the enhancement mode PFET and/or a depletion mode NFET may substitute the enhancement mode NFET provided that appropriate operational parameters are adjusted accordingly.

Figure 8:
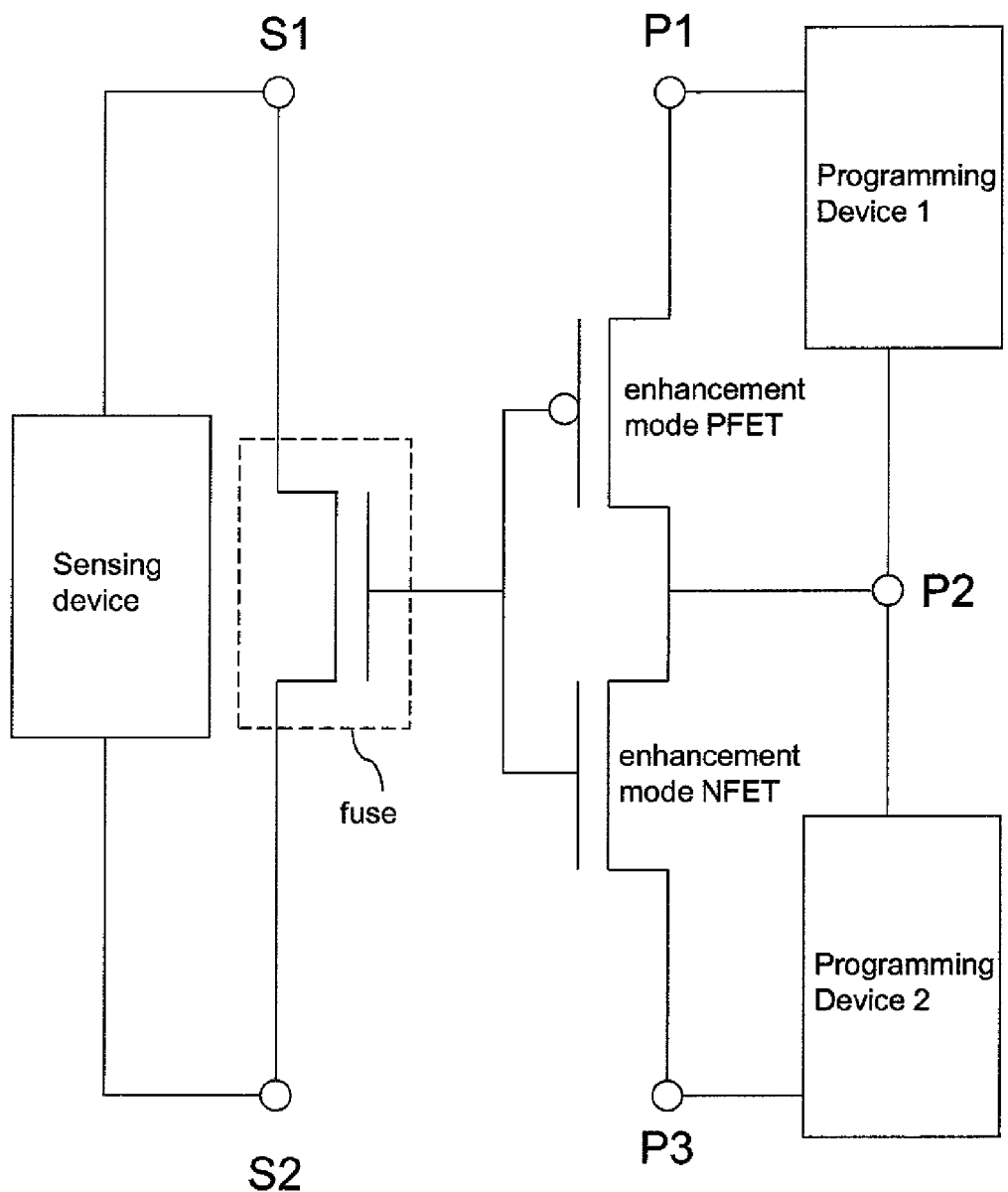
FIG. 8 is a circuit schematic for a fifth exemplary CMOS device according to a fifth embodiment of the present invention.

Referring to FIG. 8, a fifth exemplary CMOS device according to a fifth embodiment of the present invention includes an assembly of a PFET and an NFET in a series connection. A first source/drain node of the PFET and a first source/drain node of the NFET are electrically connected to each other, thereby constituting a common node labeled "P2," denoting a second programming node. A gate electrode of the PFET and a gate electrode of the NFET are electrically connected to each other and electrically floating, thereby constituting a common floating gate. The common floating gate is electrically floating, i.e., is configured to retain electrical charges therein with negligible or non-existent leakage current. Thus, the assembly of the PFET and the NFET is a floating-gate CMOS device.

The assembly of the PFET and the NFET has at least three externally accessible nodes (terminals), not counting any substrate biasing nodes (terminals) and/or well biasing nodes (terminals) that may be optionally added. A second source/drain node of the PFET that is not electrically connected to any source/drain node of the NFET is herein referred to as a "P1" node, or a first programming node. A second source/drain node of the NFET that is not electrically connected to any source/drain node of the PFET is herein referred to as a "P3" node, or a third programming node. Each of the source/drain nodes can operate as a source node or a drain node depending on the electrical bias applied thereto.

A first programming device is electrically connected to the common node P2 and a second source/drain node of the PFET, i.e., the P1 node. The first programming device is configured to induce injection of electrical charges of n-type, i.e., electrons, into the common floating gate during operation. The first programming device can include a voltage source or a current source.

A second programming device is electrically connected to the common node P2 and a second source/drain node of the NFET, i.e., the P3 node. The second programming device is configured to induce injection of electrical charges of p-type, i.e., holes, into the common floating gate during operation. The second programming device can include a voltage source or a current source.

The common floating gate of the assembly of the PFET and the NFET is electrically connected to another floating gate of another field effect transistor, which can be another PFET or another NFET. In one embodiment, the other field effect transistor can be a depletion mode NFET. In another embodiment, the other field effect transistor can be a depletion mode PFET. In yet another embodiment, the other field effect transistor can be an enhancement mode NFET. In still another embodiment, the other field effect transistor can be an enhancement mode PFET. While the fifth embodiment is illustrated with a depletion mode NFET, other embodiments are also operable provided appropriate operational parameters are adjusted accordingly.

A sensing device configured to measure output conductance of the other field effect transistor is connected to the two source/drain nodes of the other field effect transistor. The two source/drain nodes of the other field effect transistor are herein referred to as an S1 node, i.e., a first sensing node, and an S2 node, i.e., a second sensing node. The sensing device can include a voltage source that measures a current flow therethrough, or a current source that measures a required voltage to maintain the current flow. The sensing device enables measurement of the output conductance of the other field effect transistor, which is affected by the electrical charges of the common floating gate of the assembly of the PFET and the NFET, which is also a floating gate of the other field effect transistor.

The fifth exemplary CMOS device can function as a programmable erasable memory device, of which the state is determined by the type of the other field effect transistor prior to programming, and is determined by the type of electrical charges stored in the common floating gate after at least one programming or erasure. The combination of the P1 node and the P2 node can be employed to inject electrons into the common floating gate during a programming or erasure operation. The combination of the P2 node and the P3 node can be employed to inject holes into the common floating gate during an opposite type of programming or erase operation. The combination of the S1 node and the S2 node can be employed to measure the output conductance of the other field effect transistor to detect the type of charges stored in the common floating gate. The same charge injection mechanisms can be employed for the PFET and the NFET within the assembly as in the third and fourth embodiments.

The programmable erasable memory device can be repeatedly programmed and erased by injecting electrons and holes as needed. The number of programming/erasing events that can be performed on the assembly of the PFET and the NFET is limited only by the durability of the gate dielectrics of the PFET and the NFET as discussed above.

The state of the programmable erasable memory device is determined by the absence of trapped electrical charges or by the type of trapped electrical charges in the common floating gate of the assembly of the PFET and the NFET. The state of the programmable erasable memory device can be detected by differences in the measured value of the output conductance without disturbing the electrical charges in the common floating gate. If there is no trapped charge (as in the case of a pre-programming state) and if the other field effect transistor is an enhancement mode transistor, the output conductance of the other field effect transistor is low, i.e., the other field effect transistor is turned off. If there is no trapped charge and if the other field effect transistor is a depletion mode transistor, the output conductance of the other field effect transistor and is high, i.e., the other field effect transistor is turned on. If the trapped charges are positive charges and the other field effect transistor is a PFET, the output conductance of the other field effect transistor is low. If the trapped charges are positive charges and the other field effect transistor is an NFET, the output conductance of the other field effect transistor is high. If the trapped charges are negative charges and the other field effect transistor is a PFET, the output conductance of the other field effect transistor is high. If the trapped charges are negative charges and the other field effect transistor is an NFET, the output conductance of the other field effect transistor is low. The trip point, i.e., the point at which the output conductance of the other field effect transistor makes a transition from high to low or from low to high, depends on the selection of the type and the threshold voltage of the other field effect transistor connected to the sensing device.

The use of the fifth exemplary CMOS device as an erasable electrically programmable read only memory (EEPROM) is based on the operation of the other field effect transistor as a non-volatile memory element in which its channel conductance, i.e., the output conductance, can be altered in one way, either during programming or erasing, by negative charge injection into the common floating gate from the PFET and altered the other way, either during erasing or programming, by positive charge injection into the common floating gate from the NFET. The two source/drain nodes of the other field effect transistor, i.e., the S1 node and the S2 node, function as two terminals of the EEPROM for sensing purposes.

Like the first through fourth exemplary CMOS devices, the fifth exemplary CMOS device can be implemented in any CMOS manufacturing process including, but not limited to, a bulk CMOS manufacturing process, a semiconductor-on-insulator (SOI) CMOS manufacturing process, and a finFET manufacturing process. Preferably, the gate dielectrics should be sufficiently thick to meet the retention time requirement for electrical charges stored in the common floating gate. In variations of the fifth exemplary CMOS device, a depletion mode PFET may substitute the enhancement mode PFET and/or a depletion mode NFET may substitute the enhancement mode NFET provided that appropriate operational parameters are adjusted accordingly.

Figure 9:
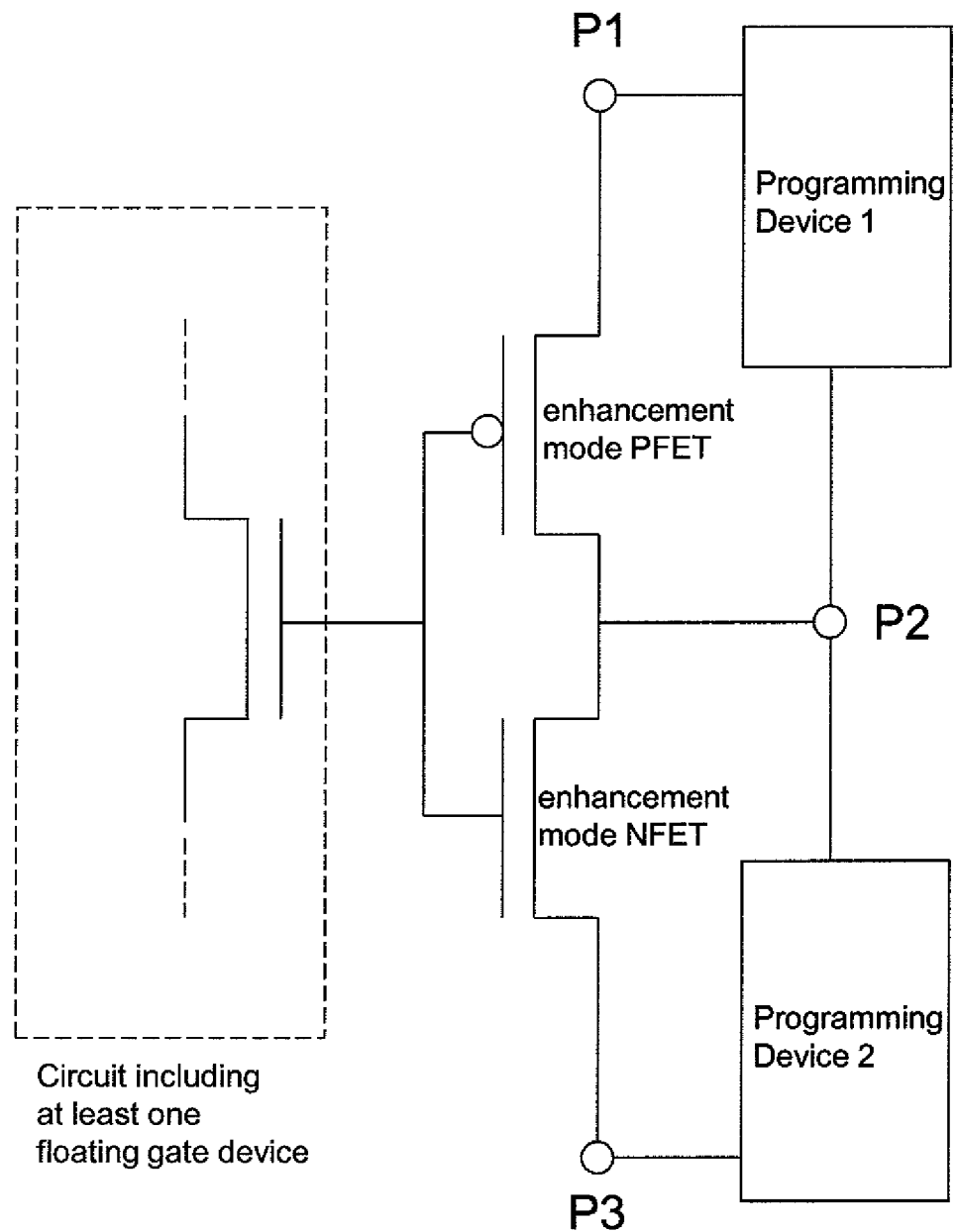
FIG. 9 is a circuit schematic for a sixth exemplary CMOS device according to a sixth embodiment of the present invention.

Referring to FIG. 9, a sixth exemplary CMOS device according to a sixth embodiment of the present invention can be derived from the fifth exemplary CMOS device by substituting the other field effect transistor and the sensing device with any circuit structure including at least one floating gate. The at least one floating gate of the circuit structure is electrically connected to the common floating gate of the assembly of the PFET and the NFET. The assembly of the PFET and the NFET is employed to program the voltage at the common floating gate, which is the same as the voltage of the at least one floating gate in the circuit structure because the common floating gate of the assembly is electrically connected to the at least one floating gate. Thus, the voltage at the at least one floating gate of the circuit structure, which can be any circuit structure having at least one floating gate, can be arbitrarily programmed employing the assembly of the PFET and the NFET having the common floating gate.

Figure 10:
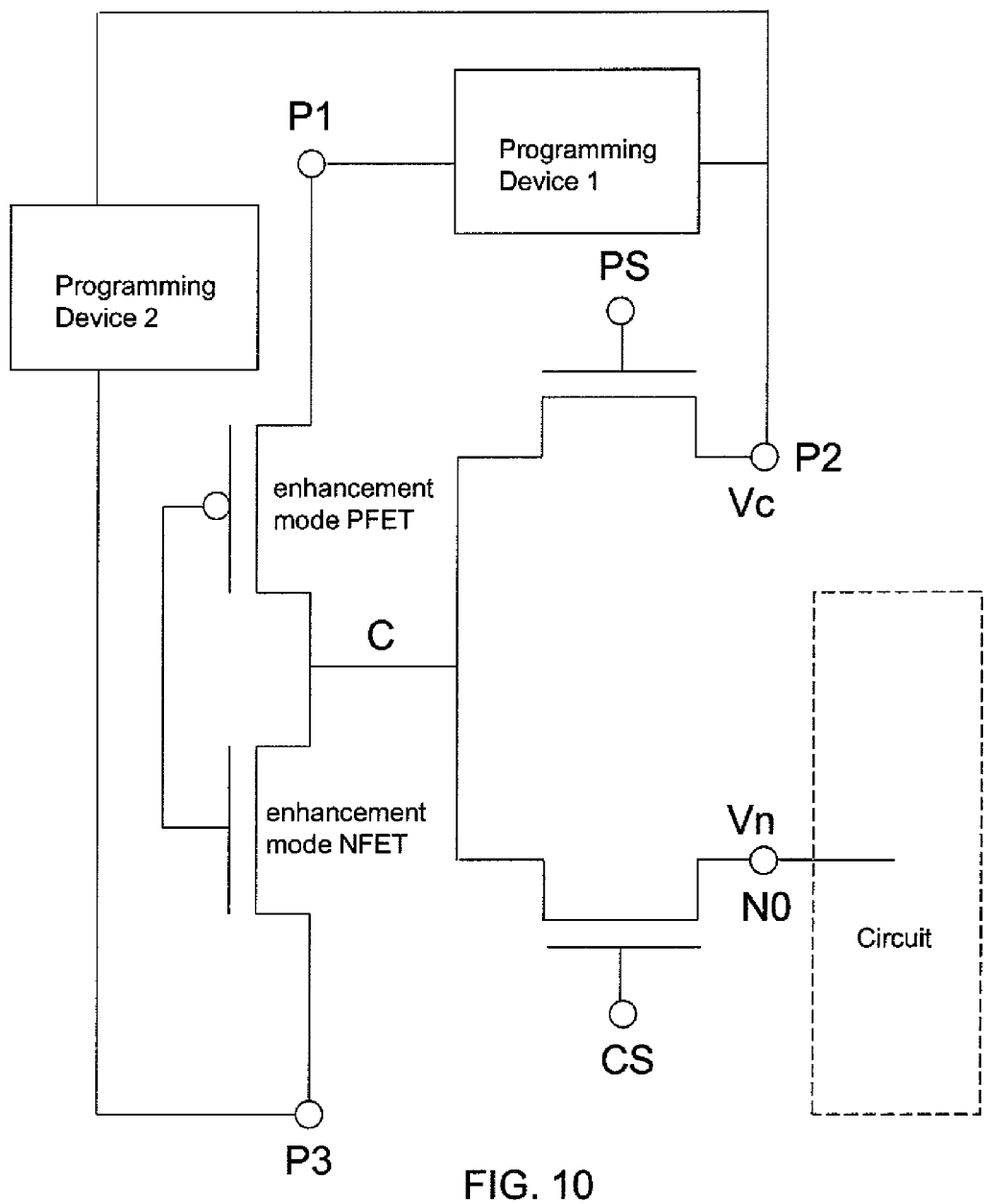
FIG. 10 is a circuit schematic for a seventh exemplary CMOS device according to a seventh embodiment of the present invention.

Referring to FIG. 10, a seventh exemplary CMOS device according to a seventh embodiment of the present invention includes an assembly of a PFET and an NFET in a series connection. A first source/drain node of the PFET and a first source/drain node of the NFET are electrically connected to each other, thereby constituting a common node "C." A gate electrode of the PFET and a gate electrode of the NFET are electrically connected to each other and electrically floating, thereby constituting a common floating gate. The common floating gate is electrically floating, i.e., is configured to retain electrical charges therein with negligible or non-existent leakage current. Thus, the assembly of the PFET and the NFET is a floating-gate CMOS device.

The assembly of the PFET and the NFET has at least three externally accessible nodes (terminals), not counting any substrate biasing nodes (terminals) and/or well biasing nodes (terminals) that may be optionally added. A second source/drain node of the PFET that is not electrically connected to any source/drain node of the NFET is herein referred to as a "P1" node, or a first programming node. A second source/drain node of the NFET that is not electrically connected to any source/drain node of the PFET is herein referred to as a "P3" node, or a third programming node. Each of the source/drain nodes can operate as a source node or a drain node depending on the electrical bias applied thereto.

The seventh exemplary CMOS device further includes a first electrical switching device and a second electrical switching device that are electrically connected to the common node. The first electrical switching device enables or disables an electrically conductive connection between the common node C and a node labeled "P2," or a second programming node. The second electrical switching device enables or disables an electrically conductive connection between the common node C and a node labeled "N0," or a circuit node that is electrically connected to at least one semiconductor device constituting an electrical circuit. The first electrical switch can be a PFET or an NFET that is controlled by a first gate electrode labeled "PS," or a programming switch node. The second electrical switch can be a PFET or an NFET that is controlled by a second gate electrode labeled "CS," or a circuit switch node. The voltage at the P2 node is herein referred to as Vc, and the voltage at the N0 node is herein referred to as Vn.

In one embodiment, the first electrical switching device and the second electrical switching device are configured to allow turning on of only one of the first electrical switching device and the second electrical switching device at a time. In this embodiment, the first and second electrical switching devices can be turned off, or only one of the first and second electrical switching devices can be turned on at any time.

The first electrical switching device can be electrically connected to the common node and at least one programming device. For example, the at least one programming device can include a first programming device electrically connected to the P1 node and the P2 node and/or a second programming device electrically connected to the P3 node and the P2 node. When the first electrical switching device is turned on, the first programming device of the seventh embodiment can function in the same manner as the first programming device of the third, fifth, and sixth embodiments, i.e., to inject electrons into the common floating gate. Further, when the first electrical switching device is turned on, the second programming device of the seventh embodiment can function in the same manner as the second programming device of the third, fifth, and sixth embodiments, i.e., to inject holes into the common floating gate. If both the first and second programming devices are employed, complementary operation of the first and second programming devices enables injection of electrical charges of the opposite type into the common floating gate, i.e., erasable and rewritable programming of the voltage of the common floating gate.

During programming, erasure, or reprogramming, a voltage is applied to the common node C. Specifically, a voltage bias is applied across the common node C and one of the P1 node and the P3 node through the first electrical switching device. Once the common floating gate accumulates sufficient electrical charges, the first electrical switching device is turned off so that the voltage bias is no longer applied. The voltage at the common node C is determined by the stored electrical charges at the common floating gate. After turning off the first electrical switching device, the voltage at the common node is applied to the N0 node, which is a high impedance node, of the electrical circuit through the second electrical switching device.

The seventh exemplary CMOS device can be employed to program and hold the voltage of a circuit node, e.g., the N0 node. For instance, the circuit can be an inverter and Vn can be an input node of the inverter. The floating-gate CMOS device can be used to perform this program and hold function.

The operation of the floating-gate CMOS device for program and hold function is as follows. The floating-gate CMOS device can be programmed such that its common node has a voltage Vc between a low value VL and a high value VH, in which the high value VH is more positive than the low value VL. For example, VL may be ground and VH may be the power supply voltage for the circuit. A voltage VL is applied to the P3 node of the NFET, while a voltage VH is applied to the P1 node of the PFET. In this configuration, the floating-gate CMOS device functions as a programmable voltage divider, with the voltage Vc at the common terminal given by $$\frac{Vc - VL}{Rch(nFET)} = \frac{VH - VL}{Rch(pFET) + Rch(nFET)},$$

where Rch(nFET) is the channel resistance of the NFET and Rch(pFET) is the channel resistance of the PFET. The channel resistances of the PFET and the NFET before programming can be designed to some target values. Rch(nFET) can be small by design in comparison with Rch(pFET) before programming. This means Vc is near VL before programming. To program Vc, the PFET is biased to cause avalanche hot electron injection into the floating gate. As electron are injected into the common floating gate, Rch(pFET) is reduced and Rch(nFET) is increased, causing Vc to rise from near VL towards VH. Once the desired channel resistances are thus programmed to give the desired value of Vc, Vc can be electrically connected to Vn, causing Vn to be held at voltage Vc.

The seventh exemplary CMOS device can function as a latch device by memorizing the state of the input at the P2 node. For example, the P1 node and the P3 node can be held at constant power supply voltages, e.g., a positive power supply voltage and electrical ground, and the voltage Vc can be an input voltage. In this example, the input voltage at the P2 node determines the type of trapped electrical charges in the common floating gate, i.e., whether electrons are trapped or holes are trapped. The type of trapped electrical charges determines which of the PFET and the NFET in the assembly stays on or off. Even after the first electrical switching device is turned off, the output conductance of each of the PFET and the NFET remain substantially the same. Thus, the voltage at the common node C is determined by the type of electrical charges in the common floating gate, and the assembly of the PFET and the NFET functions as a latch device providing an output at the common node C. By turning on the second electrical switching device and supplying the voltage at the common node C to a high impedance node N0, the stored voltage of the latch is continuously supplied to the circuit.

Like the first through sixth exemplary CMOS devices, the seventh exemplary CMOS device can be implemented in any CMOS manufacturing process including, but not limited to, a bulk CMOS manufacturing process, a semiconductor-on-insulator (SOI) CMOS manufacturing process, and a finFET manufacturing process. Preferably, the gate dielectrics should be sufficiently thick to meet the retention time requirement for electrical charges stored in the common floating gate. In variations of the seventh exemplary CMOS device, a depletion mode PFET may substitute the enhancement mode PFET and/or a depletion mode NFET may substitute the enhancement mode NFET provided that appropriate operational parameters are adjusted accordingly.

Each of the exemplary CMOS devices of the present invention can be implemented in an array environment by providing an access transistor in a series connection with the assembly of the PFET and the NFET and sharing the programming devices and the sensing devices among multiple cells on in a common row or in a common column.

Figure 11:
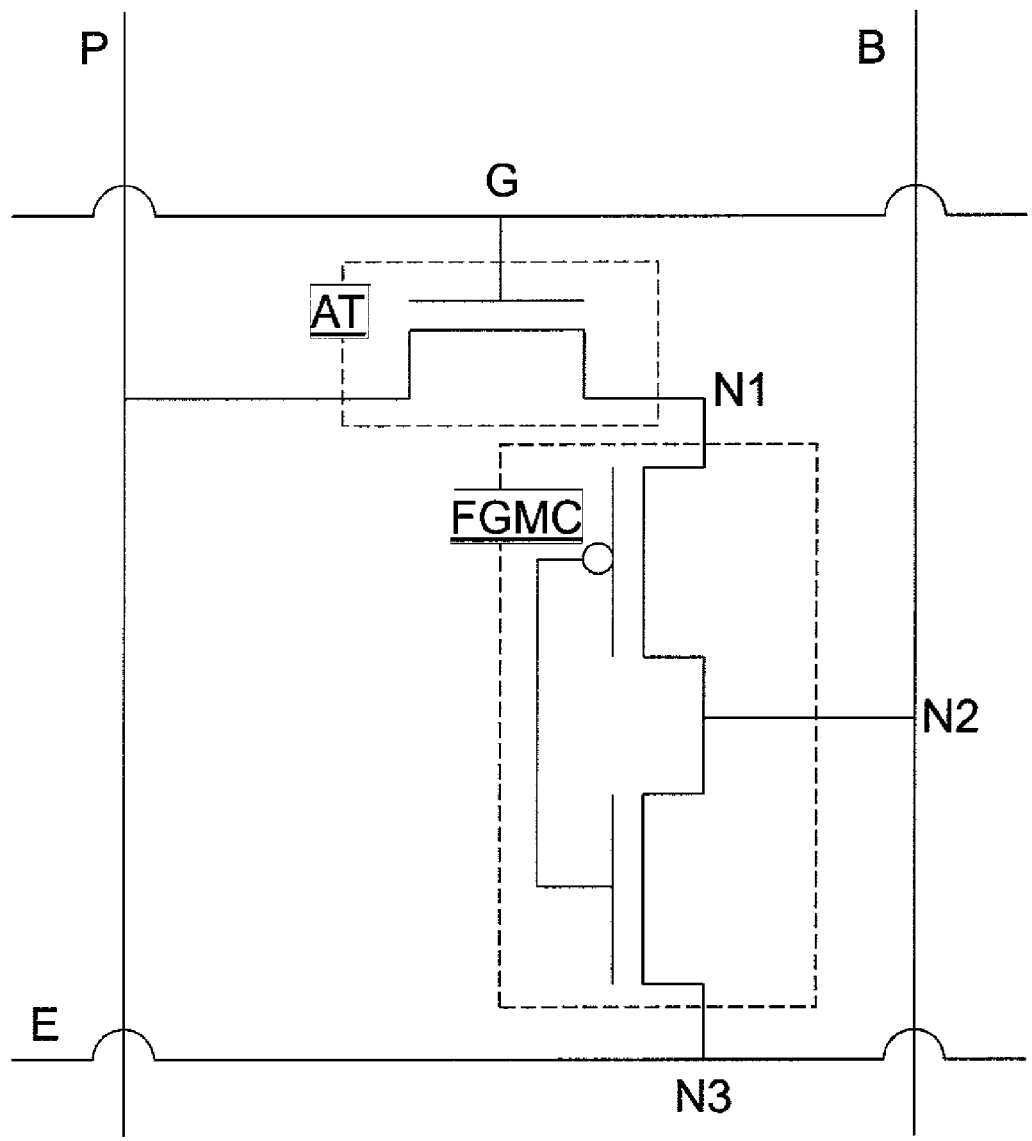
FIG. 11 is a circuit schematic for an eighth exemplary CMOS device according to an eighth embodiment of the present invention.

Referring to FIG. 11, an eighth exemplary CMOS device according to an eighth embodiment of the present invention includes a series connection of a floating gate memory cell (FGMC) and an access transistor (AT) electrically connected thereto in a series connection. The FGMC and the AT collectively constitute a unit memory cell of an array structure. The eighth exemplary CMOS device is an adaptation of the third exemplary CMOS device as a unit memory cell in an array configuration. Other exemplary CMOS structures can also be adapted as a unit memory cell in an array configuration in a manner similar to the eighth exemplary CMOS device.

The node at which the floating gate memory cell is electrically connected to the access transistor is labeled "N1." The common node between a source/drain of the PFET and a source/drain of the NFET is labeled "N2," which is electrically connected to a bit line structure schematically represented by a line labeled "B." The other source/drain of the NFET is labeled "N3," and is electrically connected to an erase line structure schematically represented by a line labeled "E." The N3 node is not electrically connected to the common node N2 or the access transistor AT. A programming line structure schematically represented by a line labeled "P" is electrically connected to a source/drain node of the access transistor AT that is different from the N1 node. A gate line structure schematically represented by a line labeled "G" is electrically connected to a gate of the access transistor AT.

Erasure can be effected by many different methods. In one non-limiting illustrative erasure method, unit memory cells can be erased, or initialized by applying a large voltage bias across an erase line and a bit line. To effect a speedy erasure or initialization, for example, all bit lines can be held at electrical ground and a selected erasure line can be applied a high positive voltage or a high negative voltage, of which the magnitude is sufficient to induce charge injection. In this case, the injection of holes from the channel or drain of the NFET into the common floating gate of each FGMC on the selected erasure line caused positive charges to be introduced into all common floating gates of the unit memory cells on the selected erasure line. Alternately, the erasure can be effected bit line by bit line by holding all erasure lines at a common voltage.

Programming can be effected by many different methods. In one non-limiting illustrative programming method, unit memory cells in the same row, i.e., sharing the same gate line and the same erase line can be programmed simultaneously. Once a row of unit memory cells to be programmed is selected by activating one of the many gate lines, each pair of a programming line and a bit line is biased to an appropriate voltage corresponding to the data to be written. If injection of electrons from the PFET into the common floating gate of an FGMC is desired, a large voltage bias is applied between the corresponding pair of the programming line and the bit line. If injection of electrons from the PFET into the common floating gate of an FGMC is not desired, the same voltage is applied between the corresponding pair of the programming line and the bit line. While the gate line is activated, i.e., while the access transistors on the selected gate line are turned on, injection of electrons occurs only at unit memory cells at which a voltage bias is present across the programming line and the bit line. Thus, only programmed unit cells store a net negative charge in the common floating gate, while unprogrammed unit cells continue to store positive charges, or no charge, in the common floating gate.

Sensing can be performed in many different methods. In one non-limiting illustrative sensing method, sensing can be performed row by row, i.e., gate line by gate line. A gate line is selected and activated to turn on all access transistors AT on the selected gate line. A low voltage bias can be applied across all programming line and an erasure line corresponding to a selected gate line. If the stored charges in the common floating gate of an FGMC are positive charges, i.e., if the unit cell memory remains erased or anti-programmed, the NFET is turned on and the PFET is turned off within the FGMC. In this case, the voltage at the N2 node, and consequently at the corresponding bit line B, is close to the voltage at the erasure line E. If the stored charges in the common floating gate of an FGMC are negative charges, i.e., if the unit cell memory is programmed, the PFET is turned on and the NFET is turned off within the FGMC. In this case, the voltage at the N2 node, and consequently at the corresponding bit line B, is close to the voltage at the programming line P. The state of all unit memory cells can be read simultaneously by measuring the voltage at all bit lines B.

During the programming operation of the eighth exemplary CMOS structure, the electrical charges are injected into the common floating gate while the access transistor AT is turned on and an electrical bias is applied across the common node, i.e., the N2 node, and the programming line (a programming line structure electrically connected to a source/drain node of the access transistor AT) of the unit memory cell. The electrical charges injected during the programming are electrical charges of a first conductivity type, i.e., electrons. During the erasure operation, electrical charges of a second conductivity type that is the opposite type of the first conductivity type, i.e., holes, are injected into the common floating gate while an electrical bias is applied across the common node and an erase line structure electrically connected to a source/drain node of one of the NFET and not electrically connected to the common node or the access transistor AT.

In general, the N2 node may be replaced with any node of the various exemplary CMOS devices discussed above to provide other unit memory cells.

Figure 12:
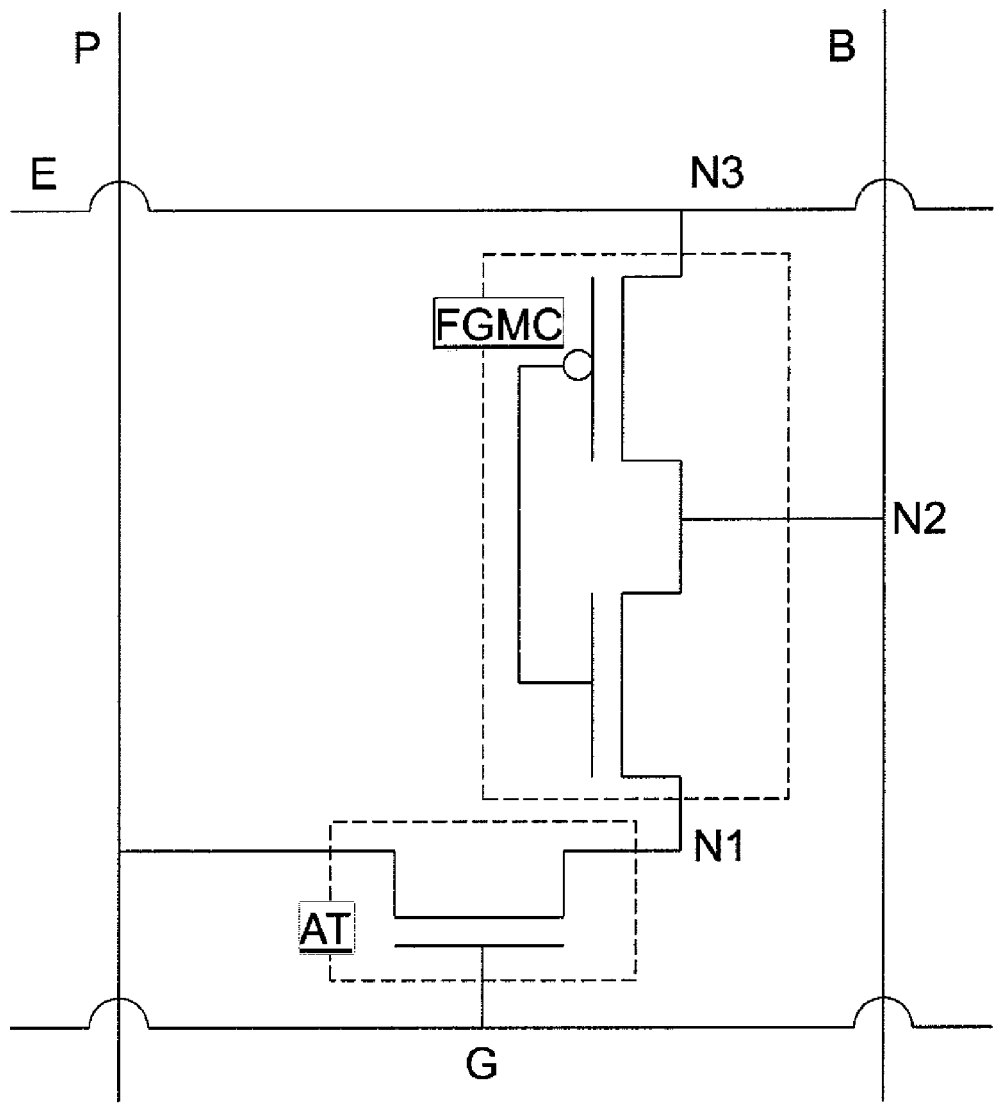
FIG. 12 is a circuit schematic for a ninth exemplary CMOS device according to a ninth embodiment of the present invention.

Referring to FIG. 12, a ninth exemplary CMOS device according to a ninth embodiment of the present invention includes a series connection of a floating gate memory cell (FGMC) and an access transistor (AT) electrically connected thereto in a series connection. The FGMC and the AT collectively constitute a unit memory cell of an array structure. The ninth exemplary CMOS device is an adaptation of the fourth exemplary CMOS device as a unit memory cell in an array configuration. Other exemplary CMOS structures can also be adapted as a unit memory cell in an array configuration in a manner similar to the ninth exemplary CMOS device.

The node at which the floating gate memory cell is electrically connected to the access transistor is labeled "N1." The common node between a source/drain of the PFET and a source/drain of the NFET is labeled "N2," which is electrically connected to a bit line structure schematically represented by a line labeled "B." The other source/drain of the PFET is labeled "N3," and is electrically connected to an erase line structure schematically represented by a line labeled "E." The N3 node is not electrically connected to the common node N2 or the access transistor AT. A programming line structure schematically represented by a line labeled "P" is electrically connected to a source/drain node of the access transistor AT that is different from the N1 node. A gate line structure schematically represented by a line labeled "G" is electrically connected to a gate of the access transistor AT.

Erasure can be effected by many different methods. In one non-limiting illustrative erasure method, unit memory cells can be erased, or initialized by applying a large voltage bias across an erase line and a bit line. To effect a speedy erasure or initialization, for example, all bit lines can be held at electrical ground and a selected erasure line can be applied a high positive voltage or a high negative voltage. In this case, the injection of electrons from the channel or drain of the PFET into the common floating gate of each FGMC on the selected erasure line causes negative charges to be introduced into all common floating gates of the unit memory cells on the selected erasure line. Alternately, the erasure can be effected bit line by bit line by holding all erasure lines at a common voltage.

Programming can be effected by many different methods. In one non-limiting illustrative programming method, unit memory cells in the same row, i.e., sharing the same gate line and the same erase line can be programmed simultaneously. Once a row of unit memory cells to be programmed is selected by activating one of the many gate lines, each pair of a programming line and a bit line is biased to an appropriate voltage corresponding to the data to be written. If injection of holes from the NFET into the common floating gate of an FGMC is desired, a large voltage bias is applied between the corresponding pair of the programming line and the bit line. The magnitude of the large voltage bias is sufficient to induce charge injection. If injection of holes from the PFET into the common floating gate of an FGMC is not desired, the same voltage is applied between the corresponding pair of the programming line and the bit line. While the gate line is activated, i.e., while the access transistors on the selected gate line are turned on, injection of holes occurs only at unit memory cells at which a voltage bias is present across the programming line and the bit line. Thus, only programmed unit cells store a net positive charge in the common floating gate, while unprogrammed unit cells continue to store negative charges, or no charge, in the common floating gate.

Sensing can be performed in many different methods. In one non-limiting illustrative sensing method, sensing can be performed row by row, i.e., gate line by gate line. A gate line is selected and activated to turn on all access transistors AT on the selected gate line. A low voltage bias can be applied across all programming line and an erasure line corresponding to a selected gate line. The magnitude of the voltage bias is not sufficient to induce charge injection. If the stored charges in the common floating gate of an FGMC are negative charges, i.e., if the unit cell memory remains erased or anti-programmed, the PFET is turned on and the NFET is turned off within the FGMC. In this case, the voltage at the N2 node, and consequently at the corresponding bit line B, is close to the voltage at the erasure line E. If the stored charges in the common floating gate of an FGMC are positive charges, i.e., if the unit cell memory is programmed, the NFET is turned on and the PFET is turned off within the FGMC. In this case, the voltage at the N2 node, and consequently at the corresponding bit line B, is close to the voltage at the programming line P. The state of all unit memory cells can be read simultaneously by measuring the voltage at all bit lines B.

During the programming operation of the ninth exemplary CMOS structure, the electrical charges are injected into the common floating gate while the access transistor AT is turned on and an electrical bias is applied across the common node, i.e., the N2 node, and the programming line (a programming line structure electrically connected to a source/drain node of the access transistor AT) of the unit memory cell. The electrical charges injected during the programming are electrical charges of a first conductivity type, i.e., holes. During the erasure operation, electrical charges of a second conductivity type that is the opposite type of the first conductivity type, i.e., electrons, are injected into the common floating gate while an electrical bias is applied across the common node and an erase line structure electrically connected to a source/drain node of one of the PFET and not electrically connected to the common node or the access transistor AT.

In general, the N2 node may be replaced with any node of the various exemplary CMOS devices discussed above to provide other unit memory cells.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
an assembly of a PFET and an NFET in a series connection, wherein a source/drain node of said PFET and a source/drain node of said NFET constitute a common node, and a gate electrode of said PFET and a gate electrode of said NFET constitute a common floating gate that is not electrically connected to any other node of any other transistor and is configured to trap and retain electrical charges therein and is electrically floating; and
a programming device configured to inject electrical charges by causing said electrical charges to pass from a channel, or a drain, of one of said PFET and said NFET through one of a gate dielectric of said PFET and a gate dielectric of said NFET into said common floating gate.

2. The semiconductor structure of claim 1, wherein said programming device is electrically connected to said common node and another source/drain node of one of said PFET and said NFET, wherein said programming device is configured to induce injection of electrical charges of a first conductivity type into said common floating gate during operation.

3. The semiconductor structure of claim 2, further comprising a sensing device electrically connected to said common node and yet another source/drain node of the other of said PFET and said NFET, wherein said sensing device is configured to measure output conductance of said other of said PFET and said NFET.

4. The semiconductor structure of claim 3, further comprising a second programming device electrically connected to said common node and said yet another source/drain node of the other of said PFET and said NFET in a parallel connection with said sensing device, wherein said second programming device is configured to inject electrical charges of a second conductivity type into said common floating gate during operation, and said second conductivity type is the opposite of said first conductivity type.

5. The semiconductor structure of claim 2, wherein said common floating gate is electrically connected to another floating gate of another field effect transistor.

6. The semiconductor structure of claim 5, further comprising a second programming device electrically connected to said common node and said yet another source/drain node of the other of said PFET and said NFET, wherein said second programming device is configured to inject electrical charges of a second conductivity type into said common floating gate during operation, and said second conductivity type is the opposite of said first conductivity type.

7. The semiconductor structure of claim 1, further comprising:
   a first electrical switching device electrically connected to said common node and said programming device; and
   a second electrical switching device electrically connected to said common node and at least one semiconductor device constituting an electrical circuit.

8. The semiconductor structure of claim 7, wherein one node of said programming device is electrically connected to a source/drain node of one of said PFET and said NFET.

9. The semiconductor structure of claim 7, wherein said first electrical switching device and said second electrical switching device are configured to allow turning on of only one of said first electrical switching device and said second electrical switching device at a time.

10. The semiconductor structure of claim 1, further comprising an access transistor electrically connected to said assembly of said PFET and said NFET in a series connection.

11. The semiconductor structure of claim 10, further comprising:
   a bit line structure electrically connected to said common node;
   a programming line structure electrically connected to a source/drain node of said access transistor;
   a gate line structure electrically connected to a gate of said access transistor; and
   an erase line structure electrically connected to a source/drain node of one of said PFET and said NFET and not electrically connected to said common node or said access transistor.

12. A method of operating a semiconductor structure comprising:
   providing a semiconductor structure including a programming device and an assembly of a PFET and an NFET in a series connection, wherein a source/drain node of said PFET and a source/drain node of said NFET constitute a common node, and a gate electrode of said PFET and a gate electrode of said NFET constitute a common floating gate that is not electrically connected to any other node of any other transistor and is configured to trap and retain electrical charges therein and is electrically floating, and said programming device is configured to inject electrical charges by causing said electrical charges to pass from a channel, or a drain, of one of said PFET and said NFET through one of a gate dielectric of said PFET and a gate dielectric of said NFET into said common floating gate; and
   injecting electrical charges through said one of said gate dielectric of said PFET and said gate dielectric of said NFET into said common floating gate.

13. The method of claim 12, wherein said electrical charges are injected during a current flow between said common node and another source/drain node of one of said PFET and said NFET.

14. The method of claim 13, further comprising sensing output conductance of said other of said PFET and said NFET between said common node and yet another source/drain node of the other of said PFET and said NFET.

15. The method of claim 14, wherein said electrical charges are electrical charges of a first conductivity type, and said method further comprises injecting electrical charges of a second conductivity type into said common floating gate, wherein said second conductivity type is the opposite of said first conductivity type.

16. The method of claim 12, wherein said common floating gate is electrically connected to another floating gate of another field effect transistor.

17. The method of claim 16, further comprising injecting electrical charges of a second conductivity type into said common floating gate during operation, wherein said second conductivity type is the opposite of said first conductivity type.

18. The method of claim 17, further comprising:
   applying a voltage to said common node through a first electrical switching device electrically connected to said common node; and
   applying a voltage at said common node to an electrical circuit through a second electrical switching device electrically connected to said common node after turning off said first electrical switching device.

19. The method of claim 17, further comprising providing an access transistor electrically connected to said assembly of said PFET and said NFET in a series connection, wherein said electrical charges are injected into said common floating gate while said access transistor is turned on and an electrical bias is applied across said common node and a programming line structure electrically connected to a source/drain node of said access transistor.

20. The method of claim 19, wherein said electrical charges are electrical charges of a first conductivity type, and said method further comprises injecting electrical charges of a second conductivity type into said common floating gate while an electrical bias is applied across said common node and an erase line structure electrically connected to a source/drain node of one of said PFET and said NFET and not electrically connected to said common node or said access transistor, and said second conductivity type is the opposite of said first conductivity type.

* * * * *